(12) United States Patent
Hashimoto

(10) Patent No.: US 9,630,200 B2
(45) Date of Patent: Apr. 25, 2017

(54) SUBSTRATE TREATMENT APPARATUS WITH ELONGATING TREATMENT LIQUID SUPPLY PIPE

(71) Applicant: SCREEN Holdings Co., Ltd., Kyoto (JP)

(72) Inventor: Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 84 days.

(21) Appl. No.: 14/539,475

(22) Filed: Nov. 12, 2014

(65) Prior Publication Data

US 2015/0068450 A1 Mar. 12, 2015

Related U.S. Application Data

(62) Division of application No. 12/722,135, filed on Mar. 11, 2010, now Pat. No. 8,899,172.

(30) Foreign Application Priority Data

Mar. 30, 2009 (JP) .................. 2009-082841
Mar. 30, 2009 (JP) .................. 2009-082842

(51) Int. Cl.
*B05C 11/08* (2006.01)
*B05B 3/00* (2006.01)
(Continued)

(52) U.S. Cl.
CPC ........ *B05B 13/0228* (2013.01); *B05C 5/0208* (2013.01); *B05C 11/023* (2013.01);
(Continued)

(58) Field of Classification Search
None
See application file for complete search history.

(56) References Cited

U.S. PATENT DOCUMENTS 5,709,593 A 1/1998 Guthrie et al. ............... 451/287
5,829,087 A 11/1998 Nishimura et al. ........... 15/88.2
(Continued)

FOREIGN PATENT DOCUMENTS

JP 8-78368 3/1996
JP 8-141533 6/1996
(Continued)

OTHER PUBLICATIONS

Priority Japanese Application No. 2009-82841, Office Action issued Apr. 4, 2013.
(Continued)

*Primary Examiner* — Binu Thomas
(74) *Attorney, Agent, or Firm* — Ostrolenk Faber LLP

(57) ABSTRACT

A substrate treatment apparatus includes: a substrate holding unit which horizontally holds a substrate; a substrate rotating unit which rotates the substrate held by the substrate holding unit about a vertical axis; a treatment liquid supplying unit which supplies a treatment liquid to an upper surface of the substrate held by the substrate holding unit; an opposing member to be located in opposed spaced relation to the upper surface of the substrate held by the substrate holding unit in contact with a film of the treatment liquid formed on the upper surface of the substrate so as to receive a lift force from the liquid film; a support member which supports the opposing member; and an opposing member holding mechanism which causes the support member to hold the opposing member in a vertically relatively movable manner.

17 Claims, 15 Drawing Sheets

(51) Int. Cl.
  *H01L 21/00*  (2006.01)
  *B05B 13/02*  (2006.01)
  *H01L 21/67*  (2006.01)
  *B05C 5/02*   (2006.01)
  *B05C 11/04*  (2006.01)
  *B05C 11/02*  (2006.01)
  *H01L 21/687* (2006.01)

(52) U.S. Cl.
  CPC ........ *B05C 11/044* (2013.01); *H01L 21/6708* (2013.01); *H01L 21/6715* (2013.01); *H01L 21/67017* (2013.01); *H01L 21/67051* (2013.01); *H01L 21/68792* (2013.01)

(56) References Cited

U.S. PATENT DOCUMENTS

| | | | |
|---|---|---|---|
| 6,280,299 B1 | 8/2001 | Kennedy et al. | 451/67 |
| 6,295,683 B1* | 10/2001 | Lai | B08B 1/04 15/77 |
| 6,357,457 B1* | 3/2002 | Taniyama | B08B 3/02 134/148 |
| 6,431,184 B1 | 8/2002 | Taniyama | 134/1.3 |
| 6,887,132 B2 | 5/2005 | Kajiwara et al. | 451/41 |
| 7,781,011 B2 | 8/2010 | Yang et al. | 118/232 |
| 2001/0036746 A1 | 11/2001 | Sato et al. | 438/745 |
| 2002/0026896 A1* | 3/2002 | Takekuma | B05C 5/002 118/302 |
| 2004/0144862 A1* | 7/2004 | Boyd | B08B 3/022 239/302 |
| 2006/0102289 A1 | 5/2006 | Fukatsu et al. | 156/345.55 |
| 2008/0311823 A1 | 12/2008 | Aiyoshizawa et al. | 451/7 |
| 2009/0162547 A1 | 6/2009 | Sawada et al. | 118/320 |
| 2009/0194509 A1 | 8/2009 | Nada et al. | 156/345.21 |
| 2010/0099342 A1 | 4/2010 | Chen et al. | 451/494 |

FOREIGN PATENT DOCUMENTS

| | | |
|---|---|---|
| JP | 2003-119600 | 4/2003 |
| JP | 2003-170128 | 6/2003 |
| JP | 2003-209039 | 7/2003 |
| JP | 2005-347761 | 12/2005 |
| JP | 2006-501691 | 1/2006 |
| JP | 2006-140385 | 6/2006 |
| JP | 2006-192251 | 7/2006 |
| JP | 2008-288541 | 11/2008 |
| KR | 10-2008-0109649 | 12/2008 |
| WO | WO 2004/032160 A2 | 4/2004 |

OTHER PUBLICATIONS

Priority Japanese Application No. 2009-82842, Office Action issued Apr. 4, 2013.

Korean Office Action (Notice of Allowance) issued on Aug. 10, 2011 in connection with corresponding Korean Patent Application No. 10-2010-0015099.

* cited by examiner

SUBSTRATE TREATMENT APPARATUS WITH ELONGATING TREATMENT LIQUID SUPPLY PIPE

CROSS-REFERENCE TO RELATED APPLICATIONS

This application is a divisional of U.S. patent application Ser. No. 12/722,135, filed Mar. 11, 2010, which claims the benefit of Japanese Patent Application Nos. 2009-082841, filed Mar. 30, 2009 and 2009-082842, filed Mar. 30, 2009, the contents of which are incorporated herein by reference.

BACKGROUND OF THE INVENTION

1. Field of the Invention

The present invention relates to a substrate treatment apparatus and a substrate treatment method for treating a substrate with a treatment liquid. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In production processes for a semiconductor device and a liquid crystal display device, a substrate such as a semiconductor wafer or a glass substrate for the liquid crystal display device is treated with a treatment liquid. A substrate treatment apparatus of a single substrate treatment type adapted to treat a single substrate at a time includes, for example, a spin chuck which horizontally holds and rotates a substrate, and a nozzle which supplies a treatment liquid onto a major surface (treatment surface) of the substrate held by the spin chuck. Where the treatment liquid is supplied onto an upper surface of the substrate held by the spin chuck, the substrate is held by the spin chuck with its front surface (treatment surface) facing up. Then, the treatment liquid is supplied to a center portion of the front surface of the substrate from the nozzle, while the substrate is rotated by the spin chuck. The treatment liquid supplied to the front surface of the substrate receives a centrifugal force generated by the rotation of the substrate to spread from the center portion toward a peripheral edge of the substrate on the front surface of the substrate.

In order to reliably cover the entire upper surface of the substrate with the treatment liquid, the treatment liquid should be supplied to the substrate at a relatively high flow rate. This increases the amount of the treatment liquid required for the treatment of the single substrate, thereby correspondingly increasing the treatment costs.

A conceivable approach to this problem is, as disclosed in Japanese Unexamined Patent Publication No. 8(1996)-78368, to provide an opposing member in closely opposed relation to the upper surface of the substrate to cover the entire upper surface for retaining a film of the treatment liquid between the opposing plate and the upper surface of the substrate while supplying the treatment liquid to the upper surface of the substrate. In this case, the film-forming treatment liquid spreads radially outward about a rotation center of the substrate in a space defined between the opposing plate and the substrate. Thus, the treatment liquid spreads over the entire upper surface of the substrate, so that a thin treatment liquid film can be retained on the entire upper surface.

In order to minimize the flow rate of the treatment liquid to be supplied to the substrate, the treatment liquid film to be formed on the upper surface of the substrate desirably has the smallest possible thickness. That is, the opposing plate is desirably spaced the smallest possible distance from the upper surface of the substrate.

However, there is a possibility that the substrate vertically wobbles during the rotation of the substrate. Even if an attempt is made to place the opposing plate in closely opposed relation to the substrate, there is a limitation in the distance between the opposing plate and the substrate. More specifically, an attempt to maintain the distance between the opposing plate and the substrate to several tenths of millimeters is likely to fail due to the vertical wobbling of the substrate. As a result of variations in the distance between the opposing plate and the substrate, the thin liquid film present between the opposing plate and the upper surface of the substrate is liable to become discontinuous, making it impossible to keep covering the upper surface of the substrate.

Where the treatment liquid is to be supplied to a lower surface of the substrate held by the spin chuck, a center axis nozzle is used which is inserted through a rotation shaft of the spin chuck. The center axis nozzle has an outlet port provided at an upper end thereof, and the outlet port is opposed to a center portion of the lower surface of the substrate held by the spin chuck.

The substrate is held by the spin chuck with its front surface (treatment surface) facing down. Then, the treatment liquid is spouted upward toward the center portion of the lower surface of the substrate from the outlet port, while the substrate is rotated by the spin chuck. The treatment liquid reaching the lower surface of the substrate receives a centrifugal force generated by the rotation of the substrate to flow from the center portion toward the peripheral edge on the lower surface of the substrate. Thus, the treatment liquid spreads over the entire lower surface of the substrate.

In order to reliably cover the entire lower surface of the substrate with the treatment liquid, the treatment liquid should be supplied to the substrate at a relatively high flow rate. This increases the amount of the treatment liquid required for the treatment of the single substrate, thereby correspondingly increasing the treatment costs.

A conceivable approach to this problem is to provide an opposing plate in closely opposed relation to the lower surface of the substrate to cover the entire lower surface for retaining a film of the treatment liquid between the opposing plate and the lower surface of the substrate while supplying the treatment liquid to the lower surface of the substrate. In this case, the film-forming treatment liquid spreads radially outward about the rotation center of the substrate in a space defined between the opposing plate and the substrate. Thus, the treatment liquid spreads over the entire lower surface of the substrate, so that a thin treatment liquid film can be retained on the entire lower surface.

However, there is a possibility that the opposing plate disposed in opposed relation to the lower surface of the substrate hinders a spin drying process which is performed on the substrate after the treatment of the substrate with the treatment liquid. The spin drying process is such that the treatment liquid adhering to the substrate is spun out by a centrifugal force generated by rotating the substrate at a higher rotation speed. In the spin drying process, a turbulent flow is liable to occur in the space between the opposing plate and the lower surface of the substrate, resulting in unsatisfactory drying of the substrate.

SUMMARY OF THE INVENTION

It is therefore an object of the present invention to provide a substrate treatment apparatus which is capable of reliably retaining a thin film of a treatment liquid on an upper surface of a substrate to perform a high quality substrate treatment while reducing the consumption of the treatment liquid, and to provide a substrate treatment method.

It is another object of the present invention to provide a substrate treatment apparatus which is capable of retaining a thin film of a treatment liquid on a lower surface of a substrate, making it possible to properly dry the substrate after a treatment with the treatment liquid while reducing the consumption of the treatment liquid.

An inventive substrate treatment apparatus includes: a substrate holding unit which horizontally holds a substrate; a substrate rotating unit which rotates the substrate held by the substrate holding unit about a vertical axis; a treatment liquid supplying unit which supplies a treatment liquid to an upper surface of the substrate held by the substrate holding unit; an opposing member to be located in opposed spaced relation to the upper surface of the substrate held by the substrate holding unit in contact with a film of the treatment liquid formed on the upper surface of the substrate so as to receive a lift force from the liquid film; a support member which supports the opposing member; and an opposing member holding mechanism which causes the support member to hold the opposing member in a vertically relatively movable manner.

With this arrangement, the treatment liquid is supplied to the upper surface of the substrate, whereby the treatment liquid film is formed on the upper surface. The treatment liquid film is rotated by the rotation of the substrate. When the opposing member contacts the treatment liquid film, therefore, the opposing member is kept in contact with a relative flow of the film-forming treatment liquid to displace the film-forming treatment liquid. The opposing member receives a lift force as a counterforce from the treatment liquid film, i.e., receives a force acting away from the upper surface of the substrate (move-away force).

The opposing member is held in a vertically movable manner by the support member. The opposing member receives the move-away force occurring due to the contact between the treatment liquid film and the opposing member to be thereby moved upward relative to the support member. The move-away force acting on the opposing member, i.e., the lift force received from the treatment liquid film by the opposing member, increases as the opposing member approaches the upper surface of the substrate. Therefore, the opposing member is retained at a position at which a force acting toward the upper surface of the substrate (a move-toward force such as a gravitational force acting on the opposing member) and the move-away force acting on the opposing member are balanced. Therefore, the opposing member can be opposed to and spaced a minute distance from the upper surface of the substrate. In addition, even if the upper surface of the substrate is vertically wobbled due to the warp or deformation of the substrate, the opposing member is correspondingly moved vertically. Therefore, the distance between the upper surface of the substrate and the opposing member is properly maintained irrespective of the vertical movement of the upper surface of the substrate. Since the treatment liquid film is reliably retained on the upper surface of the substrate, the upper surface of the substrate can be reliably covered with the liquid film. Thus, the treatment liquid film is reliably retained as having a smaller thickness on the upper surface of the substrate, thereby making it possible to extensively spread the treatment liquid over the upper surface of the substrate while supplying the treatment liquid at a lower flow rate.

The opposing member holding mechanism preferably includes a resilient member disposed between the support member and the opposing member.

With this arrangement, the resilient member is deformable, thereby permitting the movement of the opposing member relative to the support member. When the opposing member is moved upward relative to the support member and the resilient member is deformed, a restoration force occurring due to the deformation of the resilient member acts as the move-toward force on the opposing member. Thus, the construction of the opposing member holding mechanism is simplified by using the resilient member.

Examples of the resilient member include bellows, and spring members such as a coil spring, a leaf spring and a disk spring. The term "bellows" herein means a resiliently stretchable cylindrical member having a bellows-like shape.

The opposing member may have a bar-shaped substrate opposing portion which extends radially about a rotation center of the substrate held by the substrate holding unit.

With this arrangement, the substrate opposing portion of the opposing member extends radially about the rotation center of the substrate. On the other hand, the treatment liquid supplied to the upper surface of the substrate is moved outward of the substrate, while being moved in a substrate rotation direction due to the rotation of the substrate. Therefore, the extension direction of the substrate opposing portion of the opposing member crosses the treatment liquid flow direction, so that a vector component of a force generated by the flow of the treatment liquid and directing perpendicularly to the extension direction of the substrate opposing portion of the opposing member has a predetermined (non-zero) value. Therefore, the opposing member receives the lift force from the treatment liquid film along substantially the entire length thereof. Thus, the move-away force can stably act on the opposing member.

Further, the opposing member may have a substrate opposing portion extending from the rotation center to a peripheral edge of the substrate held by the substrate holding unit.

With this arrangement, the substrate opposing portion of the opposing member extends from the rotation center to the peripheral edge of the substrate. Thus, the rotation of the substrate makes it possible to retain a very thin treatment liquid film on the entire upper surface of the substrate.

The substrate opposing portion preferably has a slant surface to be opposed to the upper surface of the substrate held by the substrate holding unit, the slant surface being inclined away from the upper surface of the substrate upstream with respect to the substrate rotation direction.

With this arrangement, the opposing member is moved relative to the liquid film present on the upper surface of the substrate upstream with respect to the substrate rotation direction by the rotation of the substrate. The substrate opposing portion has the slant surface inclined away from the upper surface of the substrate upstream with respect to the substrate rotation direction, whereby the treatment liquid film can smoothly enter a space defined between the opposing member and the upper surface of the substrate.

The slant surface is inclined away from the upper surface of the substrate upstream with respect to the substrate rotation direction. Therefore, the opposing member stably receives the lift force from the treatment liquid film when being in contact with the treatment liquid film. Thus, the move-away force stably acts on the opposing member, so that a gap can be more stably defined between the opposing member and the substrate. The slant surface may be a flat surface or a convexly curved surface.

The treatment liquid supplying unit preferably includes a nozzle which spouts the treatment liquid toward the upper surface of the substrate held by the substrate holding unit at a position upstream of an area of the substrate opposed to the opposing member.

With this arrangement, the treatment liquid is supplied from the nozzle to the upper surface of the substrate at the position upstream of the area of the substrate opposed to the opposing member. Thus, the treatment liquid supplied onto the upper surface of the substrate forms the liquid film between the opposing member and the substrate immediately after the supply of the treatment liquid. As a result, the substrate can be efficiently treated.

Another inventive substrate treatment apparatus includes: a substrate holding unit which horizontally holds a substrate; a substrate rotating unit which rotates the substrate held by the substrate holding unit about a vertical axis; a treatment liquid pipe having an outlet port to be opposed to a lower surface of the substrate held by the substrate holding unit, the treatment liquid pipe extending downward from the outlet port along the vertical axis and having an inside space through which a treatment liquid flows to be supplied to the outlet port; an opposing member fixed to an upper end of the treatment liquid pipe to be opposed to the lower surface of the substrate held by the substrate holding unit; and a pipe elongating mechanism which elongates the treatment liquid pipe by a pressure of the treatment liquid to cause the treatment liquid pipe to have a greater pipe length when the treatment liquid flows through the treatment liquid pipe than when the treatment liquid does not flow through the treatment liquid pipe.

With this arrangement, the treatment liquid pipe is elongated by the pipe elongating mechanism to a greater pipe length when the treatment liquid flows through the treatment liquid pipe than when the treatment liquid does not flow through the treatment liquid pipe. Therefore, the treatment liquid pipe has a greater pipe length when the treatment liquid flows through the treatment liquid pipe to be spouted from the outlet port than when the treatment liquid is not spouted from the outlet port. The opposing member is fixed to the upper end of the treatment liquid pipe. With an arrangement such that the opposing member is located adjacent the lower surface of the substrate during the spouting of the treatment liquid, therefore, the opposing member can be moved toward the lower surface of the substrate when the treatment liquid is spouted from the outlet port, and moved away from the lower surface of the substrate when the treatment liquid is not spouted from the outlet port.

Thus, the treatment liquid film can be reliably retained as having a smaller thickness on the lower surface of the substrate by treating the lower surface of the substrate with the treatment liquid with the opposing member being located adjacent the lower surface of the substrate. This makes it possible to extensively spread the treatment liquid on the lower surface of the substrate while supplying the treatment liquid at a lower flow rate.

When the spouting of the treatment liquid is stopped after the treatment with the treatment liquid, the opposing member is moved away from the lower surface of the substrate. Therefore, a turbulent air flow can be suppressed, for example, when a spin-drying process is performed for removing a liquid component from the substrate by rotating the substrate at a higher rotation speed. Thus, the substrate can be properly dried after the treatment with the treatment liquid.

The pipe elongating mechanism preferably includes a bellows provided in an intermediate pipe wall portion of the treatment liquid pipe.

With this arrangement, the bellows is provided in the intermediate pipe wall portion of the treatment liquid pipe. The treatment liquid flows through the treatment liquid pipe while impinging on the pipe wall. Therefore, when the treatment liquid flows through the treatment liquid pipe, the bellows receives a pressure from the flowing treatment liquid to be thereby elongated. Therefore, the treatment liquid pipe is elongated when the treatment liquid flows through the treatment liquid pipe. The construction of the pipe elongating mechanism can be simplified by providing the bellows in the intermediate pipe wall portion of the treatment liquid pipe.

The opposing member may have a bar-shaped substrate opposing portion to be opposed to the lower surface of the substrate held by the substrate holding unit, the substrate opposing portion extending radially about a rotation center of the substrate rotated by the substrate rotating unit.

With this arrangement, the opposing portion of the opposing member to be opposed to the lower surface of the substrate has a bar shape extending radially about the rotation center of the substrate. Therefore, when the opposing member is located adjacent the lower surface of the substrate to be brought into contact with the treatment liquid film retained on the lower surface of the substrate, the film-forming treatment liquid spreads radially outward about the rotation center in a space defined between the opposing member and the substrate due to a surface tension of the treatment liquid film retained on the lower surface of the substrate. Thus, the treatment liquid spreads over the entire lower surface of the substrate, whereby the treatment liquid film can be retained as having a smaller thickness on the entire lower surface.

The opposing member may have a substrate opposing portion to be opposed to the lower surface of the substrate held by the substrate holding unit, the substrate opposing portion having a round shape having a smaller radius than a rotation radius of the substrate rotated by the substrate rotating unit.

With this arrangement, the opposing portion of the opposing member to be opposed to the lower surface of the substrate has a round shape having a smaller radius than the rotation radius of the substrate. Therefore, when the opposing member is located adjacent the lower surface of the substrate to be brought into contact with the treatment liquid film retained on the lower surface of the substrate, the film-forming treatment liquid spreads radially outward about the rotation center in the space defined between the opposing member and the substrate due to the surface tension of the treatment liquid film retained on the lower surface of the substrate. Thus, the treatment liquid spreads over the entire lower surface of the substrate, whereby the treatment liquid film can be retained as having a smaller thickness on the entire lower surface.

An inventive substrate treatment method includes: a substrate holding and rotating step of horizontally holding and rotating a substrate; a treatment liquid supplying step of supplying a treatment liquid to an upper surface of the substrate; and an opposing member placing step of placing an opposing member in opposed spaced relation to the upper surface of the substrate so that the opposing member can receive a lift force from a film of the treatment liquid formed on the upper surface of the substrate in contact with the treatment liquid film, the opposing member being held by a support member in a vertically relatively movable manner.

According to the inventive method, the treatment liquid is supplied to the upper surface of the substrate, whereby the treatment liquid film is formed on the upper surface. The treatment liquid film is rotated by the rotation of the substrate. When the opposing member contacts the treatment liquid film, therefore, the opposing member is kept in contact with a relative flow of the film-forming treatment liquid to displace the film-forming treatment liquid. The opposing member receives a lift force as a counterforce from the treatment liquid film, i.e., receives a force acting away from the upper surface of the substrate (move-away force).

The opposing member is held in a vertically movable manner by the support member. The opposing member receives the move-away force occurring due to the contact between the treatment liquid film and the opposing member to be moved upward relative to the support member. The move-away force acting on the opposing member, i.e., the lift force received from the treatment liquid film by the opposing member, increases as the opposing member approaches the upper surface of the substrate. Therefore, the opposing member is retained at a position at which a force acting toward the upper surface of the substrate (a move-toward force such as a gravitational force acting on the opposing member) and the move-away force acting on the opposing member are balanced. Therefore, the opposing member can be opposed to and spaced a minute distance from the upper surface of the substrate. In addition, even if the upper surface of the substrate is vertically wobbled due to the warp or deformation of the substrate, the opposing member is correspondingly moved vertically. Therefore, the distance between the upper surface of the substrate and the opposing member is properly maintained irrespective of the vertical movement of the upper surface of the substrate. Since the treatment liquid film is reliably retained on the upper surface of the substrate, the upper surface of the substrate can be reliably covered with the liquid film. Therefore, the treatment liquid film is reliably retained as having a smaller thickness on the upper surface of the substrate, thereby making it possible to extensively spread the treatment liquid over the upper surface of the substrate while supplying the treatment liquid at a lower flow rate.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
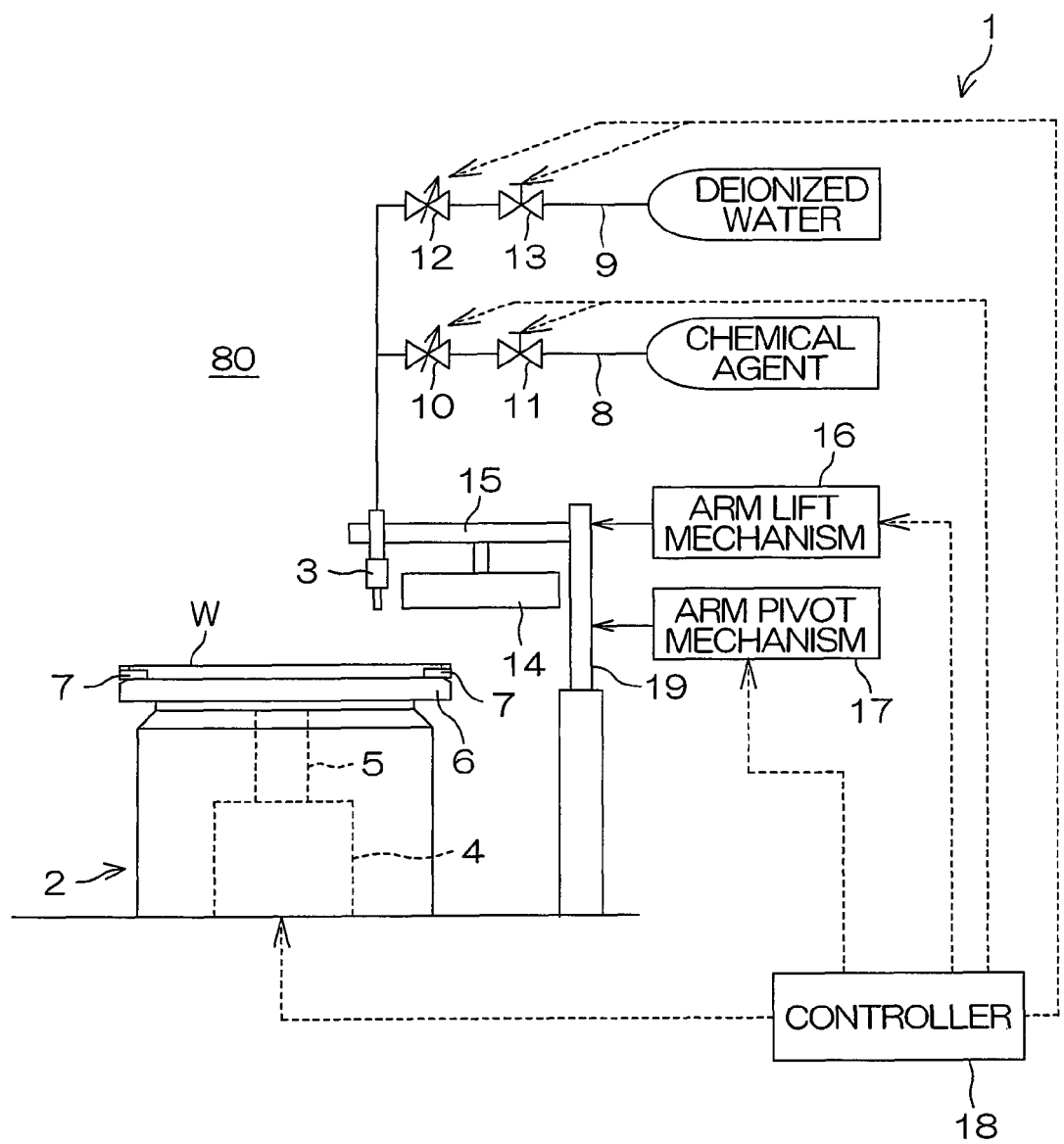
FIG. 1 is a diagram schematically showing the construction of a substrate treatment apparatus according to a first embodiment of the present invention.
Figure 2:
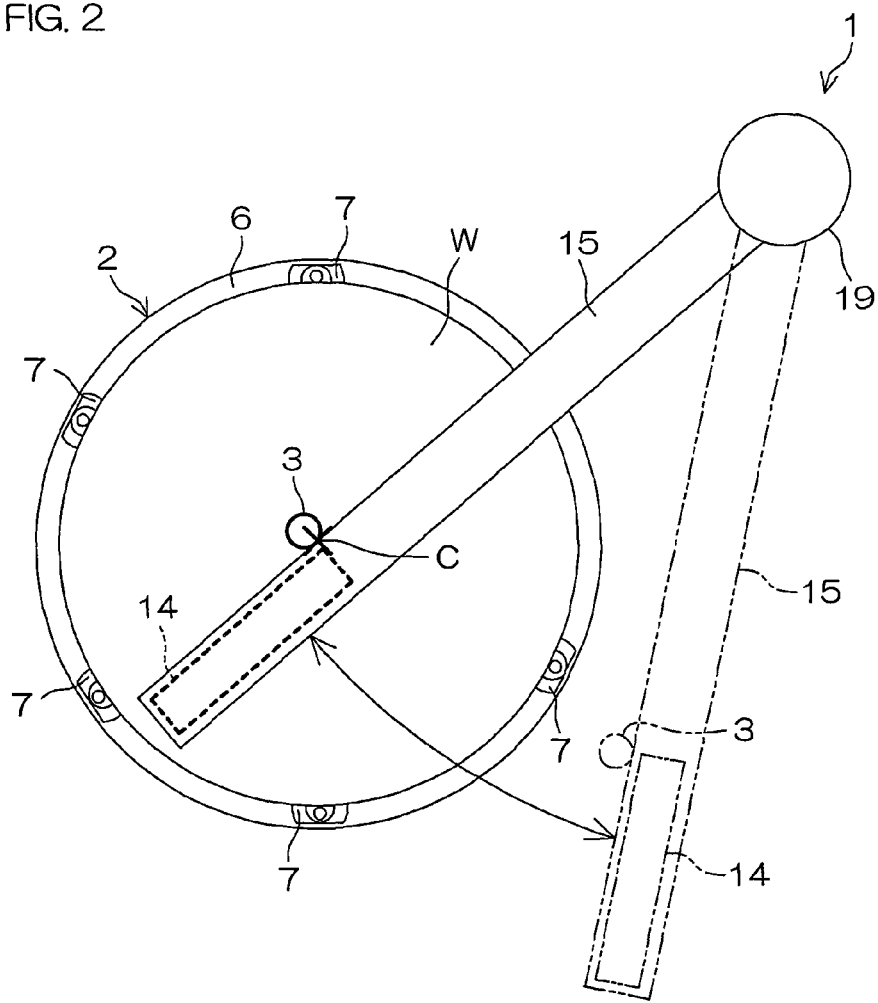
FIG. 2 is a plan view showing the schematic construction of the substrate treatment apparatus shown in FIG. 1.

FIG. 1 is a diagram schematically showing the construction of a substrate treatment apparatus 1 according to one embodiment (first embodiment) of the present invention. FIG. 2 is a plan view showing the schematic construction of the substrate treatment apparatus 1.

The substrate treatment apparatus 1 is of a single substrate treatment type for treating a front surface of a semiconductor wafer (hereinafter referred to simply as "wafer") W as an exemplary substrate with a treatment liquid (e.g., a chemical agent and deionized water).

The substrate treatment apparatus 1 includes a spin chuck (substrate holding unit) 2 which horizontally holds and rotates the wafer W, and a nozzle 3 which supplies the treatment liquid to an upper surface (front surface) of the wafer W held by the spin chuck 2. The spin chuck 2 and the nozzle 3 are provided in a treatment chamber 80 defined by a partition wall (not shown).

The spin chuck 2 includes a motor (rotating unit) 4, a spin shaft 5 unitary with a driving shaft of the motor 4, a disk-shaped spin base 6 generally horizontally attached to an upper end of the spin shaft 5, and a plurality of holder members 7 generally equidistantly disposed on a peripheral portion of the spin base 6.

The holder members 7 are capable of generally horizontally hold the wafer W. When the motor 4 is driven in this state, the wafer W is generally horizontally rotated together with the spin base 6 about a center axis of the spin shaft 5.

A chemical agent supply pipe 8 and a deionized water supply pipe 9 are connected to the nozzle 3. A chemical agent flow rate regulating valve 10 and a chemical agent valve 11 are provided in this order from the side of the nozzle 3 in the chemical agent supply pipe 8. Examples of the chemical agent to be supplied into the chemical agent supply pipe 8 include SC1 (ammonia/hydrogen peroxide mixture), SC2 (hydrochloric acid/hydrogen peroxide mixture), SPM (sulfuric acid/hydrogen peroxide mixture), hydrofluoric acid, buffered HF (hydrofluoric acid/ammonium fluoride mixture), hydrochloric acid, phosphoric acid, acetic acid, ammonia, hydrogen peroxide water, citric acid, oxalic acid and TMAH. A deionized water flow rate regulating valve 12 and a deionized water valve 13 are provided in this order from the side of the nozzle 3 in the deionized water supply pipe 9.

When the chemical agent valve 11 is opened with the deionized water valve 13 being closed, the chemical agent is supplied from a chemical agent supply source to the nozzle 3 through the chemical agent supply pipe 8. When the deionized water valve 13 is opened with the chemical agent valve 11 being closed, the deionized water is supplied from a deionized water supply source to the nozzle 3 through the deionized water supply pipe 9.

Further, an opposing bar 14 is provided as an exemplary bar-shaped opposing member above the spin chuck 2. The opposing bar 14 has a length that is half the diameter of the wafer W. The opposing bar 14 is attached to a distal end portion of an arm 15 horizontally extending above the spin chuck 2. The nozzle 3 is also attached to the distal end portion of the arm 15. The arm 15 is supported by an arm support shaft 19 generally vertically extending on a lateral side of the spin chuck 2. An arm lift mechanism 16 (see FIG. 1) including a servo motor, a ball screw mechanism and the like and an arm pivot mechanism 17 (see FIG. 1) including a motor and the like are connected to the arm support shaft 19. The arm pivot mechanism 17 is capable of pivoting the arm 15 within a horizontal plane about an axis defined on the lateral side of the spin chuck 2. The opposing bar 14 and the nozzle 3 are horizontally moved above the spin chuck 2 by the pivoting of the arm 15. Further, the arm lift mechanism 16 is capable of vertically moving up and down the arm 15. The opposing bar 14 and the nozzle 3 are moved up and down by the vertical movement of the arm 15. Thus, the arm lift mechanism 16 functions as an away/toward driving mechanism for moving the opposing bar 14 and the nozzle 3 toward and away from the wafer W.

When the wafer W is to be treated, the arm 15 is pivoted to locate the opposing bar 14 at a predetermined opposed position (an upper position or an adjacent position indicated by a bold line in FIG. 2) at which the opposing bar 14 is opposed to the upper surface of the wafer W. At the opposed position, the opposing bar 14 extends radially about a rotation center C of the wafer W from the rotation center C to a peripheral edge of the wafer W. In other words, the opposing bar 14 is located adjacent a rotation radius of the wafer W as extending parallel to the rotation radius of the wafer W. With the opposing bar 14 being located at the opposed position, the nozzle 3 is located above a center portion of the wafer W.

When the treatment of the wafer W is not performed, the opposing bar 14 and the nozzle 3 are located at a retracted position (indicated by two-dot-and-dash lines in FIG. 2) outside a wafer rotation range.

The substrate treatment apparatus 1 includes a controller 18 including a microcomputer. The controller 18 controls the driving of the motor 4, the arm pivot mechanism 17 and the arm lift mechanism 16 according to a predetermined program. Further, the controller 18 controls the opening and closing of the chemical agent valve 11 and the deionized water valve 13, and the opening degrees of the chemical agent flow rate regulating valve 10 and the deionized water flow rate regulating valve 12.

Figure 3:
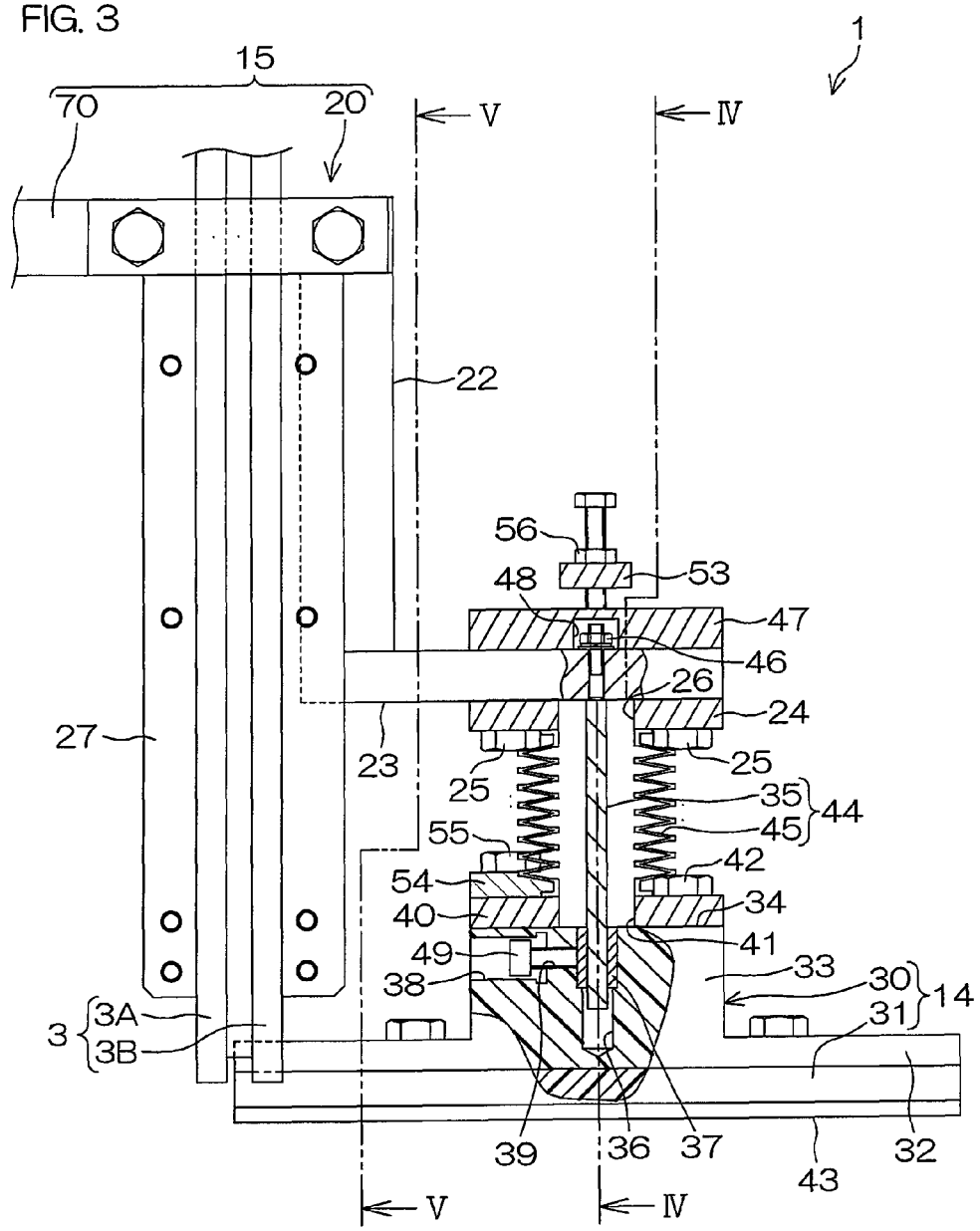
FIG. 3 is a sectional view showing the structures of a distal end portion of an arm and an opposing bar shown in FIG. 1.
Figure 4:
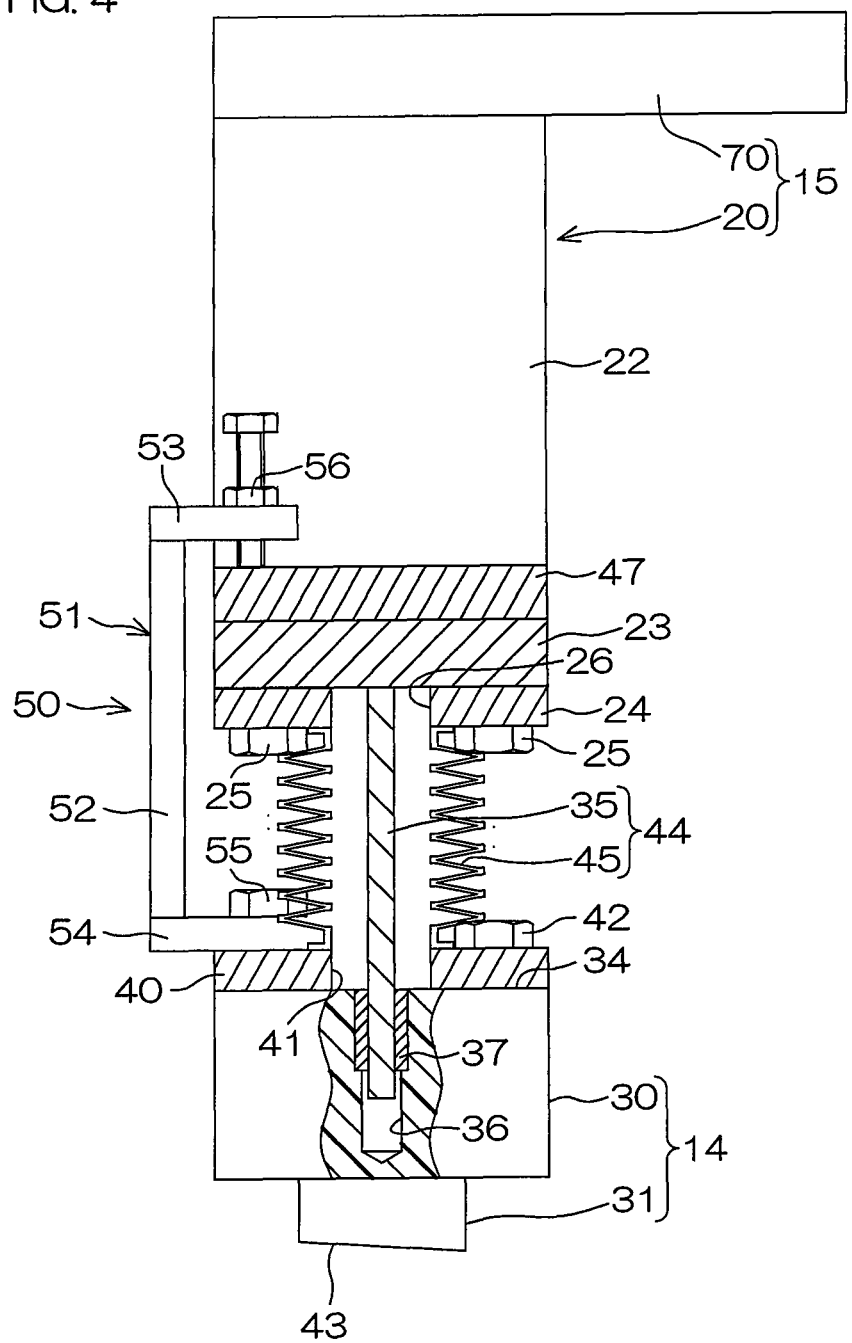
FIG. 4 is a sectional view taken along a section line IV-IV in FIG. 3.
Figure 5:
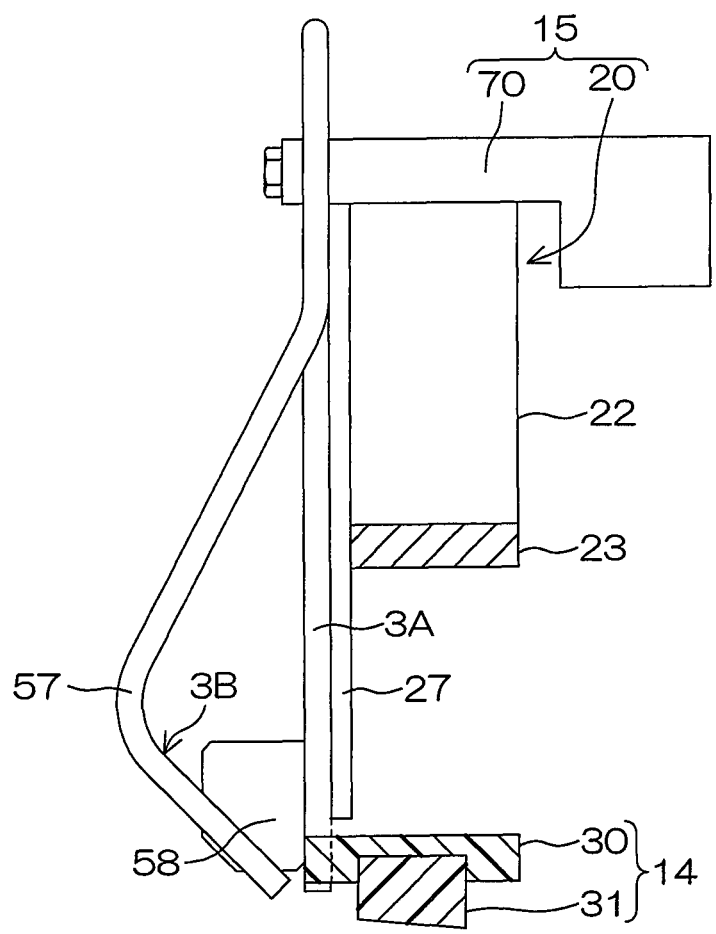
FIG. 5 is a sectional view taken along a section line V-V in FIG. 3.

FIG. 3 is a sectional view showing the structures of the distal end portion of the arm 15 and the opposing bar 14. FIG. 4 is a sectional view taken along a section line IV-IV in FIG. 3. FIG. 5 is a sectional view taken along a section line V-V in FIG. 3.

The arm 15 includes a horizontally extending arm body 70, and an L-shaped support bracket (support member) 20 attached to a distal end portion of the arm body 70 for supporting the opposing bar 14. The support bracket 20 includes a vertical plate 22 extending vertically, and a horizontal plate 23 extending horizontally from a lower edge of the vertical plate 22. An upper edge portion of the vertical plate 22 is fixed to the arm body 70. A first upper fixture plate 24 having a generally square plan shape is fixed to a lower surface of the horizontal plate 23 by bolts 25. The first upper fixture plate 24 has an upper through-hole 26 vertically extending through a center portion thereof.

A thin nozzle support plate 27 is attached to the arm body 70 for supporting the nozzle 3 (illustrated as including two nozzles 3A, 3B in the first embodiment). The nozzle support plate 27 extends vertically, and is fixed to a side surface of the support bracket 20.

The opposing bar 14 includes a body member 30, and a liquid contact member 31 attached to a lower portion of the body member 30 to be brought into contact with a treatment liquid film retained on the upper surface of the wafer W. The body member 30 includes an elongated bar member 32 extending horizontally, and a head portion 33 extending upward from a longitudinally middle portion of the bar member 32. The bar member 32 and the head portion 33 are unitarily formed of PVC (polyvinyl chloride).

The head portion 33 has a flat horizontal upper surface 34. The head portion 33 has a recess 36 provided in a longitudinally middle portion of the upper end face 34 thereof for receiving a lower end portion of a guide 35 to be described later. The recess 36 extends vertically as having a predetermined depth. A ball bush 37 is fitted in the recess 36 to serve as a cylindrical linear movement bearing. The head portion 33 further has a bolt accommodating recess 38 provided in a side surface (a left surface in FIG. 3) thereof as extending horizontally. A bolt hole 39 is provided in an innermost portion of the bolt accommodating recess 38 as communicating with the recess 36. An outer cylinder of the ball bush 37 is pressed against the head portion 33 (opposing bar 14) by a bolt 49 screwed into the bolt hole 39 to be thereby fixed to the head portion 33. A head of the bolt 49 is accommodated in the bolt accommodating recess 38.

A lower fixture plate 40 having a generally square plan shape is fixed to the upper surface of the head portion 33. The lower fixture plate 40 has a lower through-hole 41 provided in a center portion thereof as extending vertically. The lower fixture plate 40 is fixed to the head portion 33 by bolts 42.

The liquid contact member 31 has a generally rectangular cross section, and extends from one end to the other end of the body member 30 longitudinally of the body member 30. The liquid contact member 31 has a smaller width than the body member 30 as measured perpendicularly to the longitudinal direction. A lower surface of the liquid contact member 31 serves as an opposing surface 43 (substrate opposing portion) to be opposed to the upper surface of the wafer W held by the spin chuck 2. The opposing surface 43 is tapered to be inclined upward toward one side (a left side in FIG. 4) with respect to a horizontal direction perpendicular to the longitudinal direction. The liquid contact member 31 is formed of quartz, carbon or a fluororesin such as PCTFE (polychlorotrifluoroethyelene), PVDF (polyvinylidene fluoride) or PTFE (polytetrafluoroethylene).

The opposing bar 14 is retained via an opposing bar holding mechanism (opposing member holding mechanism) 44 by the support bracket 20. The opposing bar holding mechanism 44 includes the bar-shaped guide 35 extending vertically, and a bellows 45 provided as an exemplary resilient member surrounding the guide 35.

An upper end portion of the guide 35 is fixed to the lower surface of the horizontal plate 23. The upper end portion of the guide 35 is fixed to the horizontal plate 23 by a bolt 46. The lower end portion of the guide 35 is fitted in the ball bush 37. The lower end portion of the guide 35 is held in a vertically movable manner by the ball bush 37. Therefore, the guide 35 permits the vertical movement of the opposing bar 14, while preventing the horizontal movement of the opposing bar 14. A head of the bolt 46 is accommodated in an accommodation recess 48 provided in a center portion of a lower surface of a second upper fixture plate 47 fixed to an upper surface of the horizontal plate 23. A ball spline may be used instead of the guide 35 and the ball bush 37 for holding the lower end portion of the guide 46 in a vertically movable manner relative to the opposing bar 14. {Instead of the ball bush 37, a ball spline including a spline shaft serving as the guide 35 may be used for holding the lower end portion of the guide 35 in a vertically movable manner relative to the opposing bar 14.}

The bellows 45 is composed of a resin material such as PTFE (polytetrafluoroethylene), and surrounds the guide 35. An upper end of the bellows 45 is fixed to a lower surface of the first upper fixture plate 24 as surrounding the upper through-hole 26. Further, a lower end of the bellows 45 is fixed to an upper surface of the lower fixture plate 40 as surrounding the lower through-hole 41.

When the treatment of the wafer W is not performed, i.e., when the opposing bar 14 is not located adjacent the wafer W, the bellows 45 is vertically elongated by the gravitational force acting on the opposing bar 14. When the opposing bar 14 is moved up relative to the support bracket 20, the bellows 45 is compressed from the elongated state to reduce a spring force acting on the opposing bar 14. Thus, the guide 35 and the bellows 45 of the opposing bar holding mechanism 44 permit the support bracket 20 to hold the opposing bar 14 in a vertically movable manner.

The upper limit of a distance between the opposing bar 14 and the horizontal plate 23 is restricted by a distance restricting mechanism 50. The distance restricting mechanism 50 includes a restriction bracket 51 (see FIG. 4) having an open-sided rectangular shape as seen from a lateral side. The restriction bracket 51 includes a vertical plate 52 extending vertically, an upper plate 53 horizontally extending from an upper edge of the vertical plate 52, and a lower plate 54 horizontally extending from a lower edge of the vertical plate 52. The lower plate 54 is fixed to the upper surface of the lower fixture plate 40 by a bolt 55. The upper plate 53 has a screw hole (not shown) extending vertically therethrough, and a bolt 56 is screwed into the screw hole from above. A distal end of the bolt 56 abuts against an upper surface of the second upper fixture plate 47, whereby a maximum distance between the opposing bar 14 and the horizontal plate 23 is restricted.

The nozzle 3 includes a tubular first nozzle 3A and a tubular second nozzle 3B. The first nozzle 3A extends vertically, and has an outlet port provided at a distal end thereof (lower end). The distal end of the first nozzle 3A is located adjacent the liquid contact member 31. When the treatment of the wafer W is performed, the treatment liquid is spouted vertically downward from the outlet port of the first nozzle 3A toward a supply position (see FIG. 7) adjacent to the rotation center of the wafer W on the upper surface of the wafer W. The supply position is located upstream of an upper surface portion of the wafer W opposed to the liquid contact member 31.

The second nozzle 3B has a bent portion 57 having a generally chevron shape as seen from a lateral side, and an outlet port disposed at a lower end of the bent portion 57. A distal end (lower end) of the second nozzle 3B is located adjacent the liquid contact member 31. When the treatment of the wafer W is performed, the treatment liquid is spouted from the second nozzle 3B toward the aforementioned supply position (see FIG. 7) from an upstream side with respect to the direction of the rotation of the wafer W. The second nozzle 3B is fixed to a nozzle bracket 58 (see FIG. 5) attached to the nozzle support plate 27.

Figure 6:
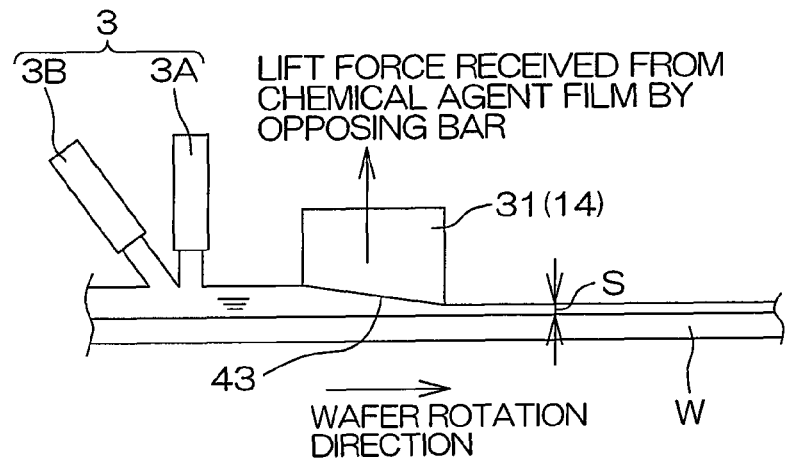
FIG. 6 is a diagram schematically showing the state of the substrate treatment apparatus of FIG. 1 observed during a chemical agent treatment.

FIG. 6 is a schematic sectional view showing the state of the substrate treatment apparatus 1 observed during a chemical agent treatment (with the opposing bar 14 kept in contact with a film of the chemical agent).

During the treatment of the wafer W, the wafer W is horizontally held and rotated by the rotation of the spin chuck 2.

During the chemical agent treatment of the wafer W, the opposing surface 43 of the liquid contact member 31 of the opposing bar 14 is located at the adjacent position in closely opposed relation to the front surface of the wafer W. In this state, the opposing surface 43 is inclined away from the upper surface of the wafer W upstream with respect to the wafer rotation direction.

The chemical agent is spouted from the nozzle 3 toward the supply position (see FIG. 7) upstream of the upper surface portion of the wafer W opposed to the opposing bar 14. The chemical agent supplied to the upper surface of the wafer W receives a centrifugal force generated by the rotation of the wafer W to spread toward the peripheral edge of the wafer W.

The opposing bar 14 located adjacent the upper surface of the wafer W contacts the chemical agent supplied onto the wafer W. The film-forming chemical agent spreads radially outward about the rotation center along the opposing bar 14 due to the surface tension of the chemical agent film on the wafer W. Thus, the opposing surface 43 permits the treatment liquid film to smoothly enter the space defined between the opposing bar 14 and the upper surface of the wafer W, because the opposing surface 43 is inclined away from the upper surface of the wafer W upstream with respect to the wafer rotation direction.

The chemical agent film retained on the upper surface of the wafer W is rotated by the rotation of the wafer W. Accordingly, the opposing bar 14 kept in contact with the chemical agent film is moved relative to the chemical agent film to displace the chemical agent film. Therefore, the opposing bar 14 receives a lift force from the chemical agent film. Thus, a force (move-away force) acts on the opposing bar 14 away from the upper surface of the wafer W.

Since the opposing surface 43 is inclined away from the upper surface of the wafer W upstream with respect to the wafer rotation direction, the opposing bar 14 receives a greater lift force from the chemical agent film. Therefore, a greater move-away force acts on the opposing bar 14.

The opposing bar 14 is vertically moved upward relative to the support bracket 20 by the move-away force. The relative movement of the opposing bar 14 vertically compresses the bellows 45 (see FIGS. 3 and 4), and a counterforce against the gravitational force (move-toward force) acting on the opposing bar 14 and the like is provided not only by the bellows 45 but also by the lift force received from the chemical agent film by the opposing bar 14. On the other hand, the move-away force acting vertically upward on the opposing bar 14 increases as the distance between the opposing surface 43 of the opposing bar 14 and the upper surface of the wafer W decreases. This is because the lift force received from the chemical agent film by the opposing bar 14 increases as the distance between the opposing bar 14 and the upper surface of the wafer W decreases. The opposing bar 14 is retained at a position at which the move-away force and the move-toward force are balanced.

A material for the bellows 45 is selected so as to minimize the distance S between the opposing bar 14 and the upper surface of the wafer W. Thus, a minute distance (e.g., about 0.1 mm) is reliably provided between the opposing bar 14 and the upper surface of the wafer W, so that the opposing bar 14 can be opposed to and spaced the minute distance S from the upper surface of the wafer W.

Figure 7:
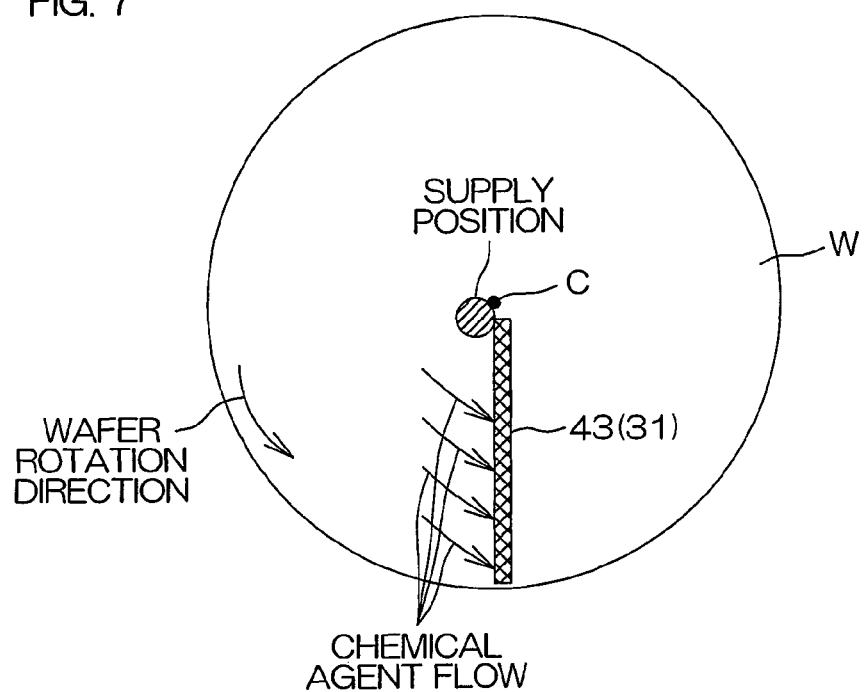
FIG. 7 is a schematic plan view showing the state of the opposing bar of FIG. 1 observed from above a wafer when the opposing bar is located at an adjacent position.

FIG. 7 is a schematic plan view showing the state of the opposing bar 14 observed from above the wafer W when the opposing bar 14 is located at the adjacent position.

When the opposing bar 14 is located at the adjacent position, the opposing surface 43 of the opposing bar 14 extends radially about the rotation center C of the wafer W from the rotation center C to the peripheral edge of the wafer W.

The chemical agent supplied to the upper surface of the wafer W is moved outward of the wafer W while being moved in the wafer rotation direction by the rotation of the wafer W. Accordingly, the extension direction of the opposing surface 43 crosses a chemical agent flow direction. Therefore, the opposing bar 14 receives the lift force from the chemical agent film along the entire length thereof. Thus, a greater move-away force can act on the opposing bar 14.

Since the opposing surface 43 of the opposing bar 14 extends from the rotation center to the peripheral edge of the wafer W, the treatment liquid film can be retained on the entire upper surface of the wafer W by the rotation of the wafer W.

Figure 8:
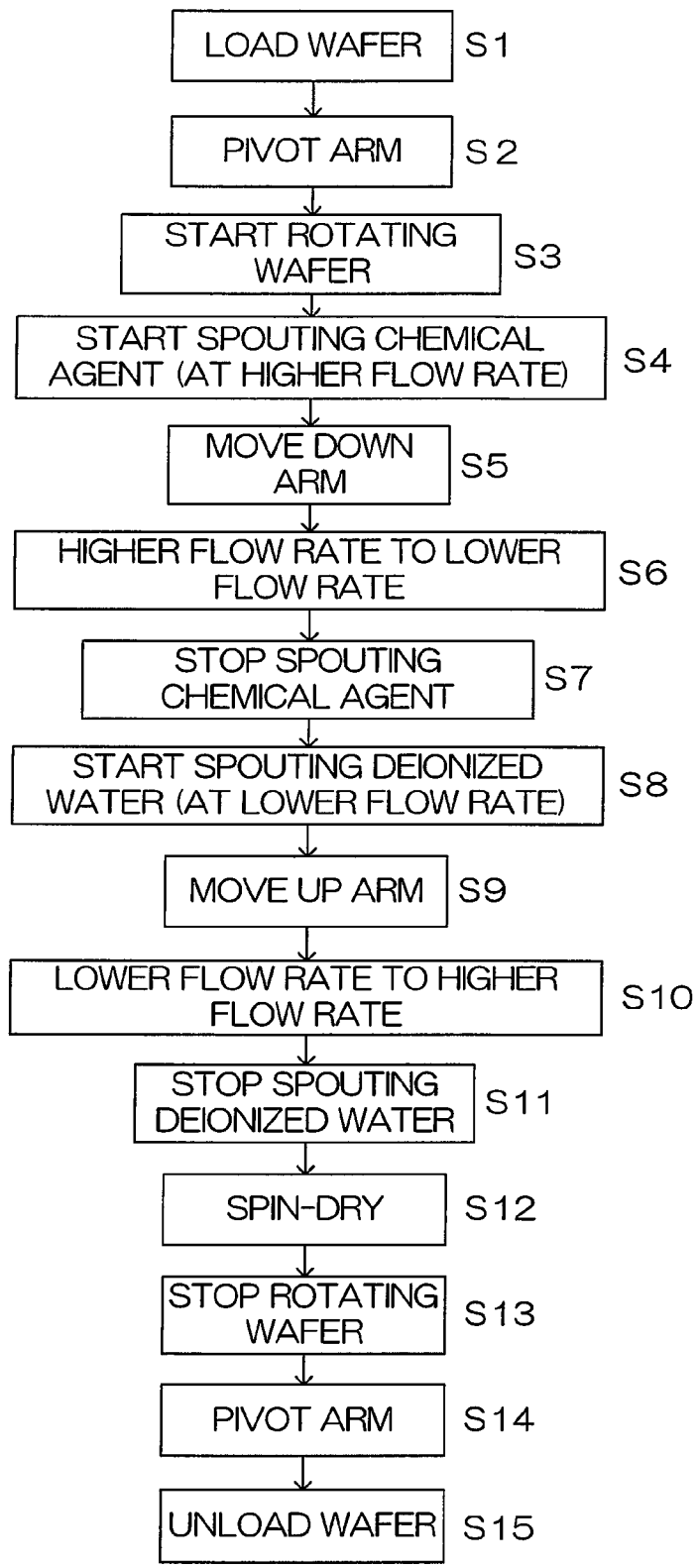
FIG. 8 is a process diagram showing an exemplary treatment to be performed by the substrate treatment apparatus shown in FIG. 1.
Figure 9:
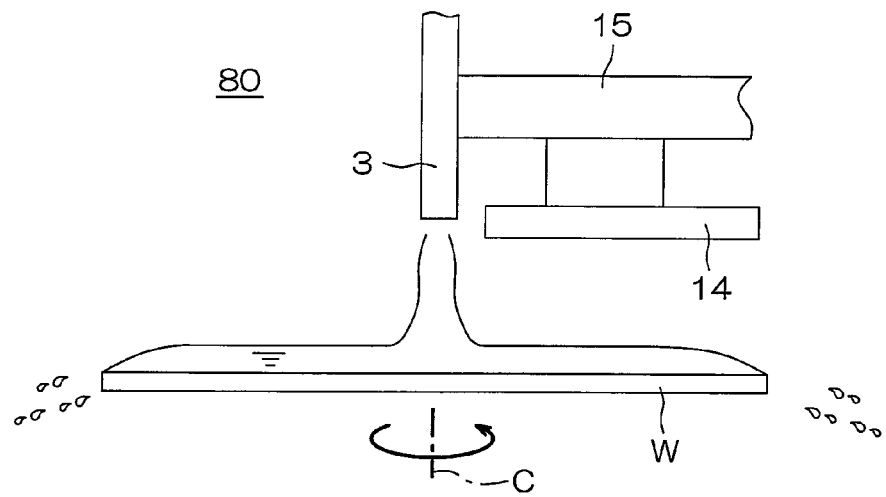
FIGS. 9(a) and 9(b) are side views for explaining the treatment of FIG. 8.
Figure 9:
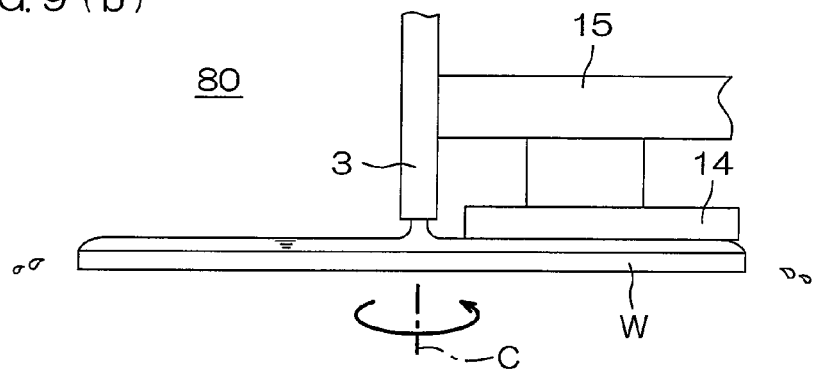

FIG. 8 is a process diagram showing an exemplary treatment to be performed by the substrate treatment apparatus 1. FIGS. 9(*a*) and 9(*b*) are side views for explaining the treatment of FIG. 8.

A wafer W to be treated is loaded into the treatment chamber 80 by a transport robot (not shown) (Step S1), and is held by the spin chuck 2 with its front surface facing up. The controller 18 controls the arm pivot mechanism 17 to pivot the arm 15 (step S2). By the pivoting of the arm 15, the nozzle 3 and the opposing bar 14 are moved from the retracted position (indicated by the two-dot-and-dash lines in FIG. 2) to a predetermined upper position (shown in FIG. 9(*a*) and indicated by solid lines in FIG. 2) at which the nozzle 3 and the opposing bar 14 are opposed to and spaced upward from the upper surface of the wafer W.

After the wafer W is retained by the spin chuck 2, the controller 18 controls the motor 4 to start rotating the wafer W (Step S3). When the rotation speed of the wafer W reaches a predetermined liquid treatment rotation speed (e.g., 1500 rpm), the controller 18 opens the chemical agent valve 11 to spout the chemical agent from the nozzle 3. Prior to the spouting of the chemical agent, the controller 18 sets the opening degree of the chemical agent flow rate regulating valve 10 at a predetermined higher level, so that the chemical agent is fed at a higher flow rate (e.g., 2 L/min.) from the chemical agent supply pipe 8 to the nozzle 3. The chemical agent fed at the higher flow rate is spouted from the nozzle 3 (Step S4). The chemical agent spouted from the nozzle 3 is supplied to a center portion of the upper surface (front surface) of the wafer W, and receives a centrifugal force generated by the rotation of the wafer W to spread toward the peripheral edge of the wafer W on the upper surface of the wafer W. Therefore, the entire upper surface of the wafer W is covered with the chemical agent (see FIG. 9(*a*)).

After a lapse of a predetermined higher-flow-rate period (e.g., 3 sec.) from the start of the spouting of the chemical agent, the controller 18 controls the arm lift mechanism 16 to move down the opposing bar 14 to the adjacent position (see FIG. 6) (Step S5). The controller 18 reduces the opening degree of the chemical agent flow rate regulating valve 10 to a predetermined lower level. Thus, the chemical agent is spouted at a lower flow rate (e.g., 0.5 L/min.) (see FIG. 9(*b*)) (Step S6). At the same time, the controller 18 controls the motor 4 to reduce the wafer rotation speed to a predetermined level (e.g., 500 rpm).

In this state, as described above, the opposing bar 14 is retained at the position at which the move-away force and the move-toward force are balanced. Thus, the upper surface of the wafer W and the opposing bar 14 are kept spaced a minute distance S from each other. The distance S is maintained by the lift force received from the chemical agent film by the opposing bar 14. Therefore, the opposing bar 14 is prevented from contacting the wafer W even if the distance S is minute.

Even if the chemical agent is spouted at the lower flow rate, or even if the wafer W is rotated at a lower rotation speed, the chemical agent can spread over the entire upper surface of the wafer W because the chemical agent film retained on the upper surface of the wafer W has a very small thickness. As a result, particles and other foreign matter adhering to the upper surface of the wafer W are physically removed from the entire upper surface of the wafer W.

Although the wafer rotation speed is reduced from the higher level (e.g., 1500 rpm) to the lower level (e.g., 500 rpm) in the chemical agent treatment, the wafer rotation speed may be kept constant at a predetermined level (e.g., at a level of 500 to 1500 rpm, preferably about 500 rpm) rather than changed during the chemical agent treatment. Where the wafer rotation speed is reduced in the chemical agent treatment, a chemical agent scattering speed at which the chemical agent is scattered from the wafer W is reduced. This suppresses the scattering of the chemical agent around the wafer W, thereby substantially preventing the chemical agent from being splashed back onto the front surface of the wafer W from peripheral components present around the wafer W.

After a lapse of a predetermined chemical agent treatment period from the start of the spouting of the chemical agent from the nozzle 3, the controller 18 closes the chemical agent valve 11 to stop spouting the chemical agent from the nozzle 3 (Step S7). Further, the controller 18 opens the deionized water valve 13 to spout the deionized water toward the center portion of the upper surface of the wafer W from the nozzle 3. Prior to the spouting of the deionized water, the controller 18 sets the opening degree of the deionized water flow rate regulating valve 12 at a predetermined lower level, so that the deionized water is fed at a lower flow rate (e.g., 0.5 L/min.) from the deionized water supply pipe 9 to the nozzle 3. Therefore, the deionized water fed at the lower flow rate is spouted from the nozzle 3 (Step S8). Thus, the chemical agent film retained on the upper surface of the wafer W is replaced with a deionized water film. Then, the chemical agent adhering to the opposing bar 14 is rinsed away with the deionized water.

After a lapse of a predetermined lower-flow-rate period (e.g., 30 sec.) from the start of the spouting of the deionized water, the controller 18 controls the arm lift mechanism 16 to move up the arm 15 (Step S9). The opposing bar 14 and the nozzle 3 are moved up to the upper position (see FIG. 9(*a*)) by the upward movement of the arm 15.

The controller 18 controls the deionized water flow rate regulating valve 12 to increase the opening degree of the deionized water flow rate regulating valve 12, so that the deionized water is spouted at a higher flow rate (e.g., 2 L/min.) from the nozzle 3 (Step S10). The deionized water supplied to the upper surface of the wafer W receives a centrifugal force generated by the rotation of the wafer W to flow toward the peripheral edge of the wafer W. Thus, the chemical agent adhering to the upper surface of the wafer W is rinsed away with the deionized water.

Step S9 and Step S10 may be exchanged with each other. That is, the arm 15 may be moved up after the flow rate of the deionized water to be spouted is increased. In this case, the deionized water film present on the wafer W is reliably prevented from becoming discontinuous (in an interim between Step S9 and Step S10).

After a lapse of a predetermined deionized water treatment period from the start of the spouting of the deionized water, the controller 18 closes the deionized water valve 13 to stop supplying the deionized water to the wafer W (Step S11). Further, the controller 18 accelerates the spin chuck 2 to a spin-drying rotation speed (e.g., about 2500 rpm). Thus, the deionized water adhering to the upper surface of the wafer W after the rinsing with the deionized water is spun off by a centrifugal force, whereby a spin drying process is performed to dry the wafer W (Step S12). After the spin drying process is performed for a predetermined spin drying period, the rotation of the spin chuck 2 is stopped (Step S13). Further, the arm 15 is pivoted to move the nozzle 3 and the opposing bar 14 back to the retracted position on the lateral side of the spin chuck 2 (Step S14). Thereafter, the wafer W is unloaded by the transport robot (not shown) (Step S15).

According to the first embodiment, as described above, the chemical agent is supplied to the upper surface of the wafer W, and the chemical agent film is retained on the upper surface. The chemical agent film is rotated by the rotation of the wafer W. Accordingly, the opposing bar 14 kept in contact with the chemical agent film is moved relative to the chemical agent film to displace the chemical agent film. Therefore, the opposing bar 14 receives the lift force from the chemical agent film. Thus, the force (move-away force) acts on the opposing bar 14 away from the upper surface of the wafer W.

The opposing bar 14 is retained in a vertically movable manner by the support bracket 20. The opposing bar 14 receives the move-away force occurring due to the contact between the chemical agent film and the opposing bar 14 to be moved upward relative to the support bracket 20. Thus, the lift force received from the chemical agent film by the opposing bar 14 increases as the opposing bar 14 approaches the upper surface of the wafer W. The move-away force acting on the opposing bar 14 increases as the opposing bar 14 approaches the upper surface of the wafer W. Therefore, the opposing bar 14 is retained at the position at which the move-toward force such as the gravitational force acting on the opposing bar 14 toward the upper surface of the wafer W and the move-away force acting on the opposing bar 14 are balanced. Thus, the opposing bar 14 can be opposed to and spaced the minute distance S from the upper surface of the wafer W. Therefore, the wafer W can be treated with the chemical agent with the opposing bar 14 being located in further adjacent relation to the upper surface of the wafer W. In this case, the chemical agent film retained on the upper surface of the wafer W has a very small thickness. This makes it possible to spread the chemical agent over the entire upper surface of the wafer W without increasing the flow rate of the chemical agent to be supplied to the wafer W.

Even if the wafer W is vertically wobbled due to the rotation of the wafer W, the opposing bar 14 is correspondingly moved up and down. Therefore, a gap is constantly and stably defined between the opposing bar 14 and the wafer W, so that the chemical agent film can be stably retained in the stably defined gap. That is, the chemical agent film is unlikely to become discontinuous. Since the thin chemical agent film is stably formed on the upper surface of the wafer W, the high quality treatment can be performed to treat the wafer W with the film-forming chemical agent.

Figure 10:
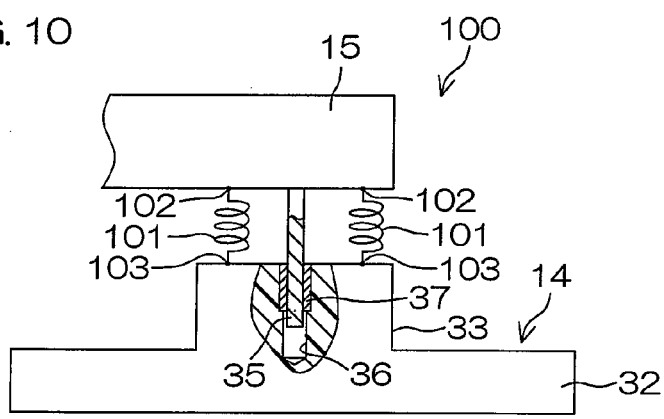
FIG. 10 is a schematic sectional view showing the construction of a substrate treatment apparatus according to a second embodiment of the present invention.

FIG. 10 is a schematic sectional view showing the construction of a substrate treatment apparatus 100 according to another embodiment (second embodiment) of the present invention. In FIG. 10, components corresponding to those according to the first embodiment will be denoted by the same reference characters as in FIGS. 1 to 9, and duplicate description will be omitted.

The second embodiment differs from the first embodiment in that a plurality of coil springs (tensile coil springs) 101 are used instead of the bellows 45 as the resilient member.

The coil springs 101 are arranged equidistantly on a circle defined about the guide 35. Upper ends (one-side ends) 102 of the coil springs 101 are fixed to the support bracket 20, and lower ends (the other-side ends) 103 of the coil springs 101 are fixed to the opposing bar 14. The coil springs 101 are elongated by the gravitational force acting on the opposing bar 14. When the opposing bar 14 is moved upward relative to the support bracket 20, the coil springs 101 are compressed from the elongated state, whereby spring forces acting on the opposing bar 14 are correspondingly reduced. As a result, a counterforce against the gravitational force acting on the opposing bar 14 is partly applied by the spring forces of the coil springs 101.

Figure 11:
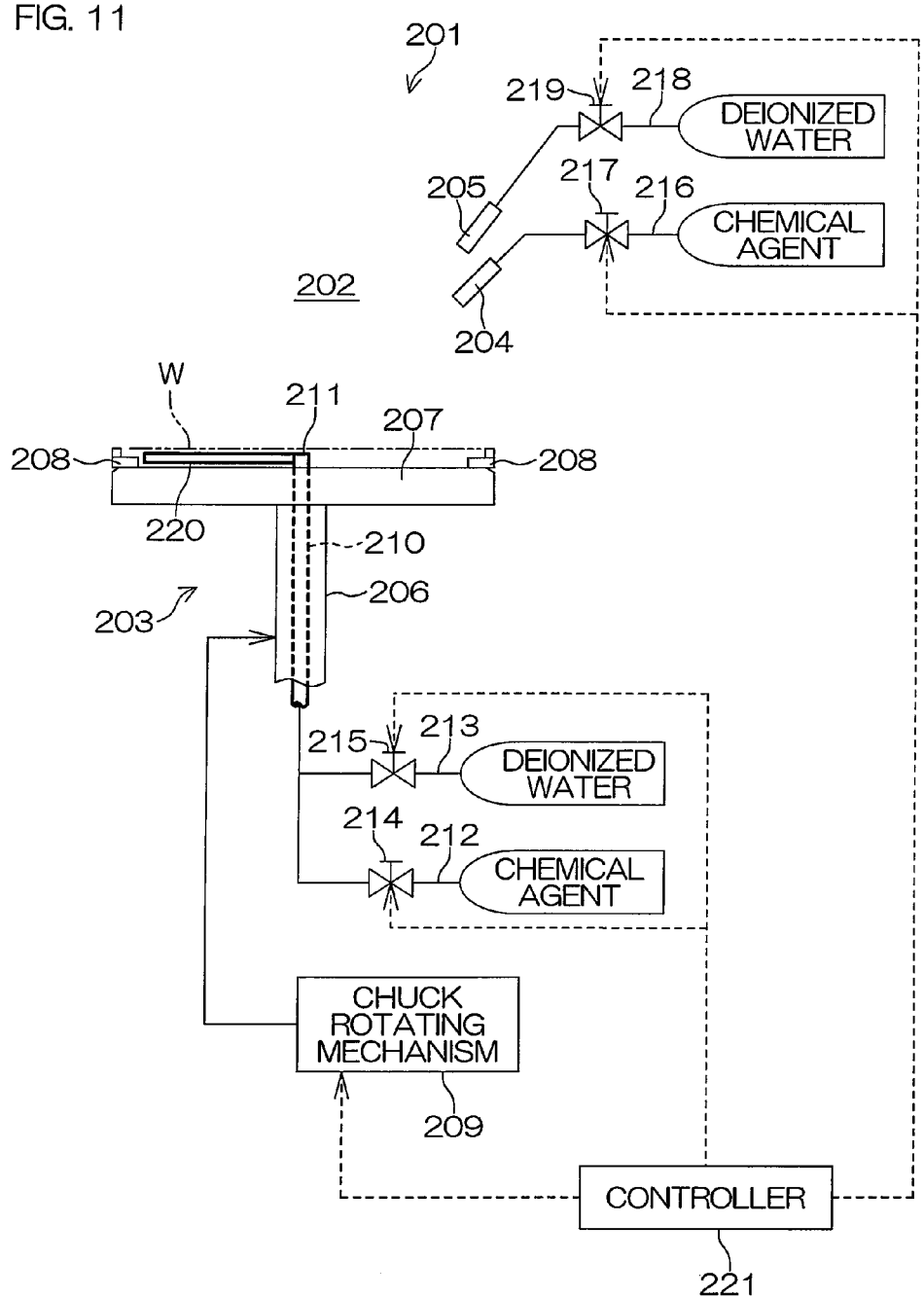
FIG. 11 is a diagram schematically showing the construction of a substrate treatment apparatus according to a third embodiment of the present invention.

FIG. 11 is a diagram schematically showing the construction of a substrate treatment apparatus 201 according to further another embodiment (third embodiment) of the present invention.

The substrate treatment apparatus 201 is of a single substrate treatment type for performing a cleaning process for removing a contaminant from a wafer W with the use of a treatment liquid.

The substrate treatment apparatus 201 includes a spin chuck (substrate holding unit) 203 which horizontally holds and rotates the wafer W, a chemical agent nozzle 204 which spouts a chemical agent toward a front surface (upper surface) of the wafer W held by the spin chuck 203, and a deionized water nozzle 205 which supplies deionized water to the front surface of the wafer W held by the spin chuck 203. The spin chuck 203, the chemical agent nozzle 204 and the deionized water nozzle 205 are provided in a treatment chamber 202 defined by a partition wall (not shown).

The spin chuck 203 includes a spin shaft 206 extending generally vertically, a disk-shaped spin base 207 generally horizontally attached to an upper end of the spin shaft 206, and a plurality of holder members 208 disposed on a peripheral portion of the spin base 207. The holder members 208 are arranged generally equidistantly on a circle defined about a center axis of the spin shaft 206. The wafer W is held by the holder members 208 with its peripheral surface abutting against the holder members 208, whereby the wafer W is generally horizontally retained with its center aligning with the center axis of the spin shaft 206.

A torque is inputted to the spin shaft 206 from a chuck rotating mechanism (substrate rotating unit) 209 including a motor (not shown). The spin shaft 206 is rotated by the inputted torque, whereby the wafer W held by the holder members 208 is rotated together with the spin base 207 about the center axis of the spin shaft 206.

The spin shaft 206 is a hollow shaft, in which a lower surface treatment liquid pipe (treatment liquid pipe) 210 for the supply of the treatment liquid (a chemical agent or deionized water) is inserted in a relatively rotatable manner. The lower surface treatment liquid pipe 210 has a lower surface outlet port (outlet port) 211 provided at its upper end to open above the spin base 207.

A lower chemical agent supply pipe 212 to which the chemical agent is supplied from a chemical agent supply source and a lower deionized water supply pipe 213 to which deionized water is supplied from a deionized water supply source are connected to the lower surface treatment liquid pipe 210. A lower chemical agent valve 214 for opening and closing the lower chemical agent supply pipe 212 is provided in the lower chemical agent supply pipe 212. A lower deionized water valve 215 for opening and closing the lower deionized water supply pipe 213 is provided in the lower deionized water supply pipe 213.

When the lower chemical agent valve 214 is opened with the lower deionized water valve 215 being closed, the chemical agent is supplied into the lower surface treatment liquid pipe 210 from the lower chemical agent supply pipe 212. The chemical agent is fed to the lower surface outlet port 211 through the lower surface treatment liquid pipe 210, and spouted upward from the lower surface outlet port 211. By spouting the chemical agent from the lower surface outlet port 211 with the wafer W being held by the spin chuck 203, the chemical agent is supplied to a rear surface (lower surface) of the wafer W.

Examples of the chemical agent to be spouted from the lower surface outlet port 211 include SC1 (ammonia/hydrogen peroxide mixture), SC2 (hydrochloric acid/hydrogen peroxide mixture), SPM (sulfuric acid/hydrogen peroxide mixture), hydrofluoric acid, buffered HF (hydrofluoric acid/ammonium fluoride mixture), hydrochloric acid, phosphoric acid, acetic acid, ammonia, hydrogen peroxide water, citric acid, oxalic acid and TMAH.

When the lower deionized water valve 215 is opened with the lower chemical agent valve 214 being closed, the deionized water is supplied into the lower surface treatment liquid pipe 210 from the lower deionized water supply pipe 213. The deionized water flows through the lower surface treatment liquid pipe 210, and is spouted upward from the lower surface outlet port 211. By spouting the deionized water from the lower surface outlet port 211 with the wafer W being held by the spin chuck 203, the deionized water is supplied to the rear surface (lower surface) of the wafer W.

The chemical agent nozzle 204 is disposed in fixed relation to the spin chuck 203 above the spin chuck 203. An upper chemical agent supply pipe 216 to which the chemical agent is supplied from the chemical agent supply source is connected to the chemical agent nozzle 204. An upper chemical agent valve 217 which opens and closes the upper chemical agent supply pipe 216 is provided in the upper chemical agent supply pipe 216. When the upper chemical agent valve 217 is opened, the chemical agent is supplied into the chemical agent nozzle 204 from the upper chemical agent supply pipe 216. Thus, the chemical agent is spouted from the chemical agent nozzle 204.

The deionized water nozzle 205 is disposed in fixed relation to the spin chuck 203 above the spin chuck 203. An upper deionized water supply pipe 218 to which the deionized water is supplied from the deionized water supply source is connected to the deionized water nozzle 205. An upper deionized water valve 219 is provided in the upper deionized water supply pipe 218. When the upper deionized water valve 219 is opened, the deionized water is supplied into the deionized water nozzle 205 from the upper deionized water supply pipe 218. Thus, the deionized water is spouted from the deionized water nozzle 205. By spouting the deionized water from the deionized water nozzle 205 with the wafer W being held by the spin chuck 203, the deionized water is supplied to the front surface of the wafer W.

The chemical agent nozzle 204 is not necessarily required to be disposed in fixed relation to the spin chuck 203. For example, the chemical agent nozzle 204 may be attached to an arm pivotal within a horizontal plane above the spin chuck 203 to serve as a so-called scan nozzle which is capable of moving a chemical agent application position on the front surface of the wafer W by the pivoting of the arm. The deionized water nozzle 205 is not necessarily required to be disposed in fixed relation to the spin chuck 203, but may be provided in the form of a so-called scan nozzle.

Further, an opposing bar 220 is provided as an exemplary bar-shaped opposing member above the spin base 207. One end of the opposing bar 220 is fixed to the upper end of the lower surface treatment liquid pipe 210. The opposing bar 220 is opposed to the rear surface (lower surface) of the wafer W held by the holder members 208 (i.e., the wafer W held by the spin chuck 203).

The substrate treatment apparatus 201 includes a controller 221 including a microcomputer. The controller 221 controls the driving of the chuck rotating mechanism 209 according to a predetermined program, and controls the opening and closing of the upper chemical agent valve 217, the opening and closing of the upper deionized water valve 219, the opening and closing of the lower chemical agent valve 214 and the opening and closing of the lower deionized water valve 215.

Figure 12:
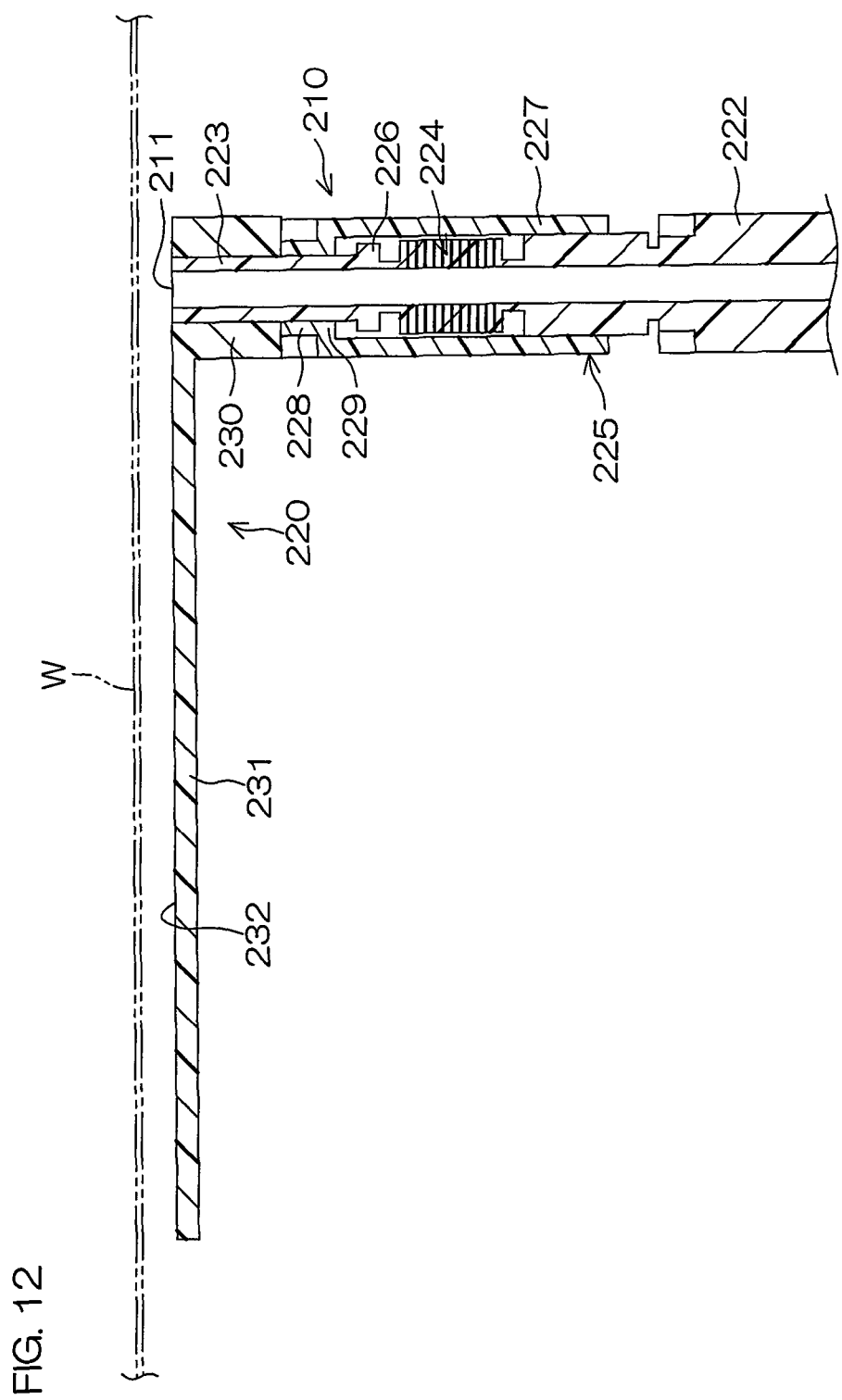
FIG. 12 is a sectional view showing the structures of a lower surface treatment liquid pipe and an opposing bar shown in FIG. 11.
Figure 13:
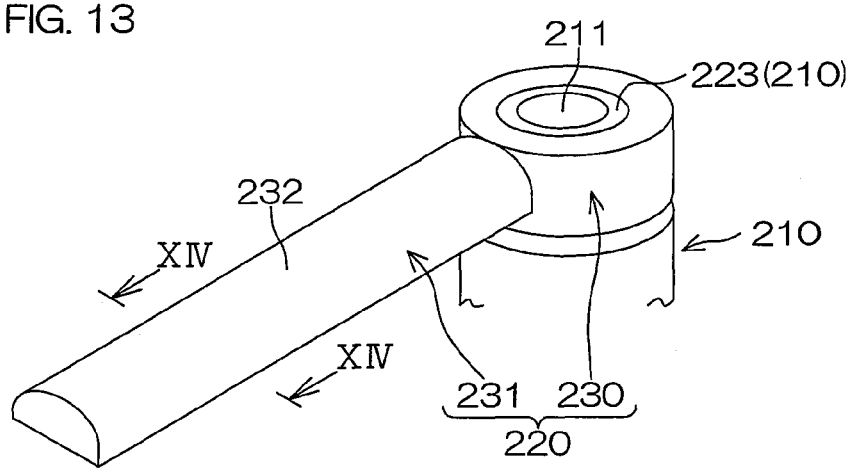
FIG. 13 is a perspective view schematically showing the structures of the lower surface treatment liquid pipe and the opposing bar shown in FIG. 11.

FIG. 12 is a sectional view showing the structures of the lower surface treatment liquid pipe 210 and the opposing bar 220 shown in FIG. 11. FIG. 13 is a perspective view schematically showing the structures of the opposing bar 220 and the lower surface treatment liquid pipe 210 shown in FIG. 11.

The lower surface treatment liquid pipe 210 is fixedly disposed in the treatment chamber 202 as extending vertically as a whole, and includes a generally cylindrical main pipe portion 222 connected to the lower chemical agent supply pipe 212 and the lower deionized water supply pipe 213, a generally cylindrical outlet pipe portion 223 defining a distal end portion (upper end portion) thereof, and a bellows portion 224 connecting the outlet pipe portion 223 to the main pipe portion 222. The main pipe portion 222, the bellows portion 224 and the outlet pipe portion 223 are unitarily formed of a resin material (e.g., PVC (polyvinyl chloride) or PTFE (polytetrafluoroethylene)) which is resistant to chemical agents.

The outlet pipe portion 223 and the main pipe portion 222 are coaxial with each other. The outlet pipe portion 223 has substantially the same inner diameter as the main pipe portion 222, and a smaller outer diameter than the main pipe portion 222. The lower surface outlet port 211 opens at an upper end of the outlet pipe portion 223. The lower surface outlet port 211 has, for example, a round shape.

The bellows portion 224 is axially (vertically) stretchable. When the bellows portion 224 is elongated or compressed, the outlet pipe portion 223 disposed on the distal side of the bellows portion 224 is correspondingly moved up or down. In the third embodiment, a wall surface of the lower surface treatment liquid pipe 210 is defined by an inner peripheral surface of the outlet pipe portion 223, an inner peripheral surface of the bellows portion 224 and an inner peripheral surface of the main pipe portion 222.

An outer member 225 is fitted around the lower surface treatment liquid pipe 210. The outer member 225 includes a cylindrical body portion 227 surrounding the outer periphery of the bellows portion 224 and the outer periphery of a restriction projection 226 (to be described later), a cylindrical guide cylinder 228 having an inner peripheral surface having a smaller diameter than the body portion 227 and opposed to the outlet pipe portion 223, and an annular restriction wall portion 229 connecting an upper edge of the body portion 227 to a lower edge of the guide cylinder 228. The body portion 227 and the guide cylinder 228 extend coaxially vertically. A lower portion of the body portion 227 is fixed to the outer periphery of an upper portion of the main pipe portion 222.

The outlet pipe portion 223 of the lower surface treatment liquid pipe 210 is inserted in the cylindrical guide cylinder 228. The guide cylinder 228 serves to guide an outer peripheral surface of the outlet pipe portion 223 when the outlet pipe portion 223 is moved up and down by the elongation and compression of the bellows portion 224. The inner periphery of the guide cylinder 228 has substantially the same diameter as the outer periphery of the outlet pipe portion 223.

Figure 15:
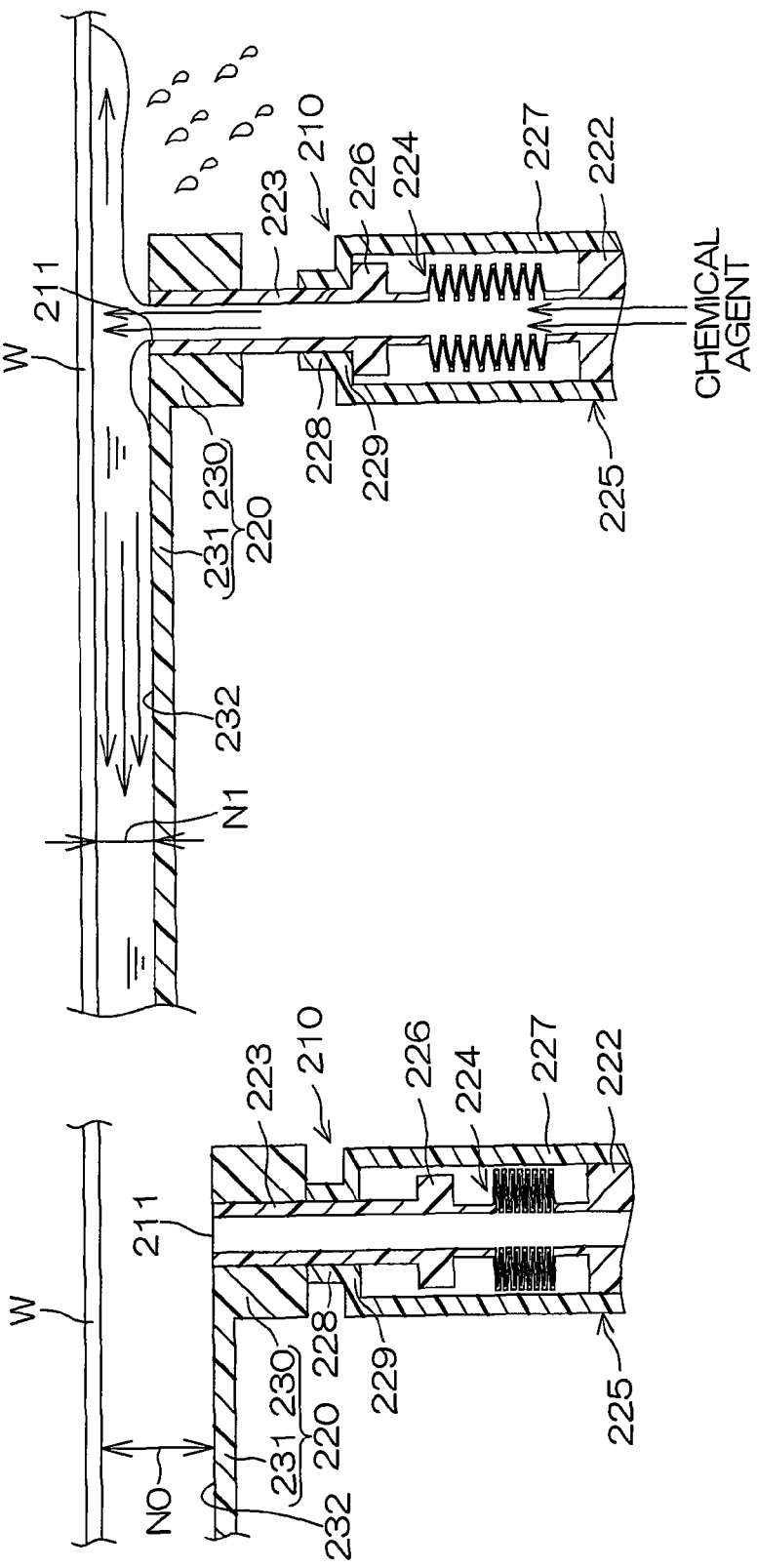
FIGS. 15(a) and 15(b) are sectional views schematically showing the structures of the lower surface treatment liquid pipe and the opposing bar shown in FIG. 11.

The restriction projection 226 is provided around a lower portion of the outlet pipe portion 223 as projecting radially outward from the periphery of the outlet pipe portion 223. The restriction projection 226 is brought into abutment against the restriction wall portion 229 to restrict the movement of the outlet pipe portion 223 relative to the outer member 225. The restriction projection 226 is, for example, an annular projection, which is disposed at a position such that the opposing bar 220 is located at an adjacent position (shown in FIG. 15(b)) to be described later when the restriction projection 226 abuts against the restriction wall portion 229.

The opposing bar 220 includes a cylindrical fixture portion 230 provided about the rotation center axis of the wafer W, and a bar portion 231 horizontally extending from the fixture portion 230 radially about the rotation center of the wafer W. The opposing bar 220 extends from the rotation center C to the peripheral edge of the wafer W radially about the rotation center of the wafer W.

The fixture portion 230 and the bar portion 231 are unitarily formed of quartz, carbon or a fluororesin such as PCTFE (polychlorotrifluoroethyelene), PVDF (polyvinylidene fluoride) or PTFE (polytetrafluoroethylene).

The fixture portion 230 is fitted around and fixed to an upper portion of the outlet pipe portion 223. When the bellows portion 224 of the lower surface treatment liquid pipe 210 is compressed (see FIG. 12), a lower end face of the fixture portion 230 of the opposing bar 220 contacts an upper end face of the body portion 227 of the outer member 225.

Figure 14:
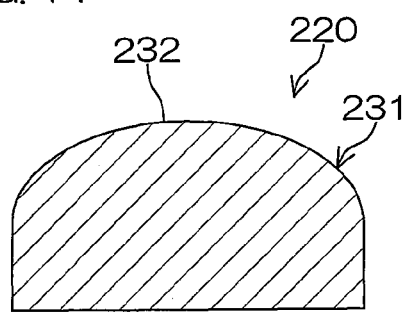
FIG. 14 is a sectional view taken along a section line XIV-XIV in FIG. 13.

FIG. 14 is a sectional view taken along a section line XIV-XIV in FIG. 13.

An upper surface of the bar portion 231 serves as a substrate opposing surface (substrate opposing portion) 232 which is opposed to the lower surface of the wafer W held by the spin chuck 203. The substrate opposing surface 232 is an oval cylindrical surface having a horizontally extending major axis and a vertically extending minor axis. An uppermost portion of the substrate opposing surface 232 is generally flush with the upper end face of the fixture portion 230 (see FIGS. 13 and 14).

FIGS. 15(a) and 15(b) are sectional views schematically showing the structures of the lower surface treatment liquid pipe 210 and the opposing bar 220. FIG. 15(a) illustrates a state in which the treatment liquid is not spouted from the lower surface outlet port 211, while FIG. 15(b) illustrates a state in which the treatment liquid is spouted from the lower surface outlet port 211.

When the treatment liquid is not spouted from the lower surface outlet port 211, i.e., when the treatment liquid (the chemical agent or the deionized water) does not flow through the lower surface treatment liquid pipe 210, the bellows portion 224 is vertically compressed by the gravitational force acting on the opposing bar 220 and the outlet pipe portion 223. At this time, the opposing bar 220 is located at a spaced position (shown in FIGS. 12 and 15(a)) at which the opposing bar 220 is spaced from the lower surface of the wafer W. When the opposing bar 220 is located at the spaced position, an upper portion of the substrate opposing surface 232 and the lower surface of the wafer W are spaced a distance N0 (e.g., not less than 5 mm, preferably 5 mm) such that a turbulent flow does not occur in a space between the substrate opposing surface 232 of the opposing bar 220 and the lower surface of the wafer W when the wafer W is rotated at a spin drying rotation speed (e.g., 2500 rpm).

When the treatment liquid is spouted from the lower surface outlet port 211, i.e., when the chemical agent from the lower chemical agent supply pipe 212 (see FIG. 11) or the deionized water from the lower deionized water supply pipe 213 (see FIG. 11) (the chemical agent and the deionized water are hereinafter collectively referred to as "treatment liquid") flows through the lower surface treatment liquid pipe 210, the treatment liquid impinges on the pipe wall. Therefore, the bellows portion 224 receives a pressure from the flowing treatment liquid. Thus, the bellows portion 224 is deformed from a compressed state (see FIGS. 12 and 15(a)) to an axially elongated state (see FIG. 15(b)) against the gravitational forces acting on the opposing bar 220 and the outlet pipe portion 223 and the spring force of the bellows portion 224.

When the bellows portion 224 is deformed from the compressed state to the elongated state, the outlet pipe portion 223 of the lower surface treatment liquid pipe 210 is moved up, and the outlet pipe portion 223 fitted in the guide cylinder 228 is moved upward relative to the outer member 225 with its peripheral surface being guided by the guide cylinder 228. By the upward movement of the outlet pipe portion 223, the opposing bar 220 fixed to the outlet pipe portion 223 is also moved up. In other words, the lower surface treatment liquid pipe 210 is elongated as a whole, and the opposing bar 220 fixed to the upper end of the lower surface treatment liquid pipe 210 is moved up. Then, the restriction projection 226 interferes with the restriction wall portion 229 of the outer portion 225, whereby the upward movement of the outlet pipe portion 223 is restricted. When the treatment liquid is spouted, the opposing bar 220 is located at the adjacent position (shown in FIG. 15 (*b*)) at which the upper portion of the substrate opposing surface 232 of the opposing bar 220 is opposed to and spaced a minute distance N1 (e.g., 0.5 mm) from the lower surface of the wafer W. The distance N1 is smaller than the thickness of the treatment liquid film retained on the lower surface of the wafer W. Therefore, the opposing bar 220 contacts the treatment liquid retained on the lower surface of the wafer W when being located at the adjacent position. With the opposing bar 220 being located at the adjacent position, the spring force of the bellows portion 224 acts vertically downward on the opposing bar 220.

The chemical agent supplied to the lower surface of the wafer W receives a centrifugal force generated by the rotation of the wafer W to flow from the center portion to the peripheral edge of the wafer W over the lower surface of the wafer W. Further, the film-forming treatment liquid spreads radially outward about the rotation center of the wafer W in the space between the opposing bar 220 and the wafer W due to the surface tension of the treatment liquid film retained on the lower surface of the substrate W.

Figure 16:
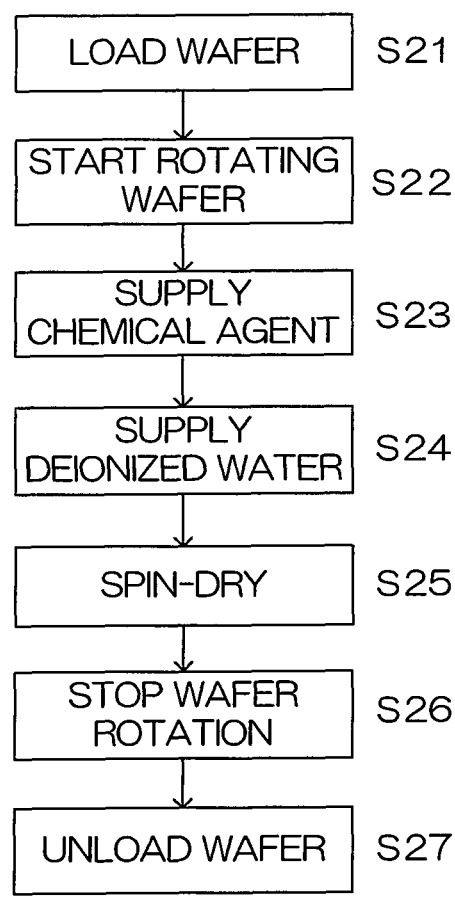
FIG. 16 is a process diagram showing an exemplary treatment to be performed by the substrate treatment apparatus shown in FIG. 11.

FIG. 16 is a process diagram showing an exemplary treatment to be performed by the substrate treatment apparatus 201.

A wafer W to be treated is loaded into the treatment chamber 202 by a transport robot (not shown) (Step S21), and held by the spin chuck 203 with its front surface facing up.

After the wafer W is held by the spin chuck 203, the controller 221 controls the chuck rotating mechanism 209 to start rotating the wafer W (Step S22). When the rotation speed of the wafer W reaches a predetermined liquid treatment rotation speed (e.g., 500 to 1500 rpm, preferably 1500 rpm), the controller 221 opens the upper chemical agent valve 217 to spout the chemical agent from the chemical agent nozzle 204 (Step S23, a chemical agent supplying step). The chemical agent supplied to the center portion of the front surface (upper surface) of the wafer W spreads from the center portion to the peripheral edge of the wafer W on the upper surface of the wafer W. As a result, particles and other foreign matter adhering to the upper surface of the wafer W are removed from the entire upper surface of the wafer W.

Further, the controller 221 opens the lower chemical agent valve 214 to spout the chemical agent from the lower surface outlet port 211 (Step S23, the chemical agent supplying step). At this time, the flow rate of the chemical agent to be spouted from the lower surface outlet port 211 is set at a relative low level, e.g., 0.5 L/min.

When the lower chemical agent valve 214 is opened, the chemical agent from the chemical agent supply source flows into the lower surface treatment liquid pipe 210 through the lower chemical agent supply pipe 212. When the chemical agent flows through the lower surface treatment liquid pipe 210, the bellows portion 224 is deformed from the compressed state to the elongated state. Thus, the lower surface treatment liquid pipe 210 is elongated, whereby the opposing bar 220 is moved up from the spaced position (shown in FIGS. 12 and 15(*a*)) to the adjacent position (shown in FIG. 15(*b*)).

The chemical agent supplied to the lower surface of the wafer W receives a centrifugal force generated by the rotation of the wafer W to flow from the center portion to the peripheral edge of the wafer W on the lower surface of the wafer W. The film-forming chemical agent spreads radially outward about the rotation center of the wafer W in the space between the opposing bar 220 and the wafer W due to the surface tension of the chemical agent film retained on the lower surface of the wafer W. Thus, even if the chemical agent is spouted from the lower surface outlet port 211 at a lower flow rate, the chemical agent spreads over the entire lower surface of the wafer W. Therefore, a thin chemical agent film can be retained on the entire lower surface of the wafer W. As a result, particles and other foreign matter adhering to the lower surface of the wafer W are removed from the entire lower surface of the wafer W.

After a lapse of a predetermined chemical agent treatment period from the start of the supply of the chemical agent from the chemical agent nozzle 204, the controller 221 closes the upper chemical agent valve 217 to stop spouting the chemical agent from the chemical agent nozzle 204. Further, the controller 221 closes the lower chemical agent valve 214 to stop spouting the chemical agent from the lower surface outlet port 211.

Further, the controller 221 opens the upper deionized water valve 219 to spout the deionized water from the deionized water nozzle 205 toward the center portion of the upper surface of the wafer W (Step S24, a deionized water supplying step). The deionized water supplied to the upper surface of the wafer W receives a centrifugal force generated by the rotation of the wafer W to flow toward the periphery of the wafer W. Thus, the chemical agent adhering to the upper surface of the wafer W is rinsed away with the deionized water.

Substantially simultaneously with the closing of the lower chemical agent valve 214, the controller 221 opens the lower deionized water valve 215 to spout the deionized water from the lower surface outlet port 211 toward the center portion of the lower surface of the wafer W (Step S24, the deionized water supplying step). Thus, the chemical agent film retained on the lower surface of the wafer W is replaced with a deionized water film.

When the lower deionized water valve 215 is opened, the deionized water from the deionized water supply source flows into the lower surface treatment liquid pipe 210 through the lower deionized water supply pipe 213. At this time, the deionized water flows through the lower surface treatment liquid pipe 210, so that the bellows portion 224 is maintained in the elongated state. Therefore, the opposing bar 220 is maintained at the adjacent position (shown in FIG. 15(*b*)).

The deionized water supplied to the lower surface of the wafer W receives a centrifugal force generated by the rotation of the wafer W to flow from the center portion to the peripheral edge of the wafer W on the lower surface of the wafer W. The film-forming deionized water spreads radially outward about the rotation center of the wafer W in the space between the opposing bar 220 and the wafer W due to the surface tension of the opposing bar 220 opposed to the lower surface of the wafer W. Thus, the deionized water spreads over the entire lower surface of the wafer W. The chemical agent adhering to the lower surface of the wafer W is rinsed away with the deionized water.

After a lapse of a predetermined deionized water treatment period from the start of the spouting of the deionized water from the deionized water nozzle 205, the controller 221 closes the upper deionized water valve 219 to stop supplying the deionized water to the upper surface of the wafer W. Further, the controller 221 closes the lower deionized water valve 215 to stop supplying the deionized water to the lower surface of the wafer W.

When the lower deionized water valve 215 is closed, the flow of the deionized water into the lower surface treatment liquid pipe 210 is stopped. Therefore, the bellows portion 224 of the lower surface treatment liquid pipe 210 is deformed to the compressed state. Thus, the opposing bar 220 receives the gravitational force and the spring force of the bellows portion 224 to be moved down to the spaced position (shown in FIGS. 12 and 15(a)).

The controller 221 accelerates the spin chuck 203 to a spin drying rotation speed (e.g., about 2500 rpm). Thus, deionized water adhering to the upper and lower surfaces of the wafer W after the rinsing with the deionized water is spun off by a centrifugal force to dry the wafer W (Step S25). During the spin drying process, the lower surface of the wafer W is spaced the distance N0 from the upper surface of the opposing bar 220, so that a significant turbulent flow does not occur. Therefore, the lower surface of the wafer W can be advantageously dried.

After the spin drying process is performed for a predetermined spin drying period, the rotation of the spin chuck 203 is stopped (Step S26). Thereafter, the wafer W is unloaded from the treatment chamber 202 by the transport robot (not shown) (Step S27).

According to this embodiment, as described above, the lower surface treatment liquid pipe 210 is elongated to a greater pipe length by the deformation of the bellows portion 224 when the treatment liquid flows through the lower surface treatment liquid pipe 210 than when the treatment liquid does not flow through the lower surface treatment liquid pipe 210. When the treatment liquid flows through the lower surface treatment liquid pipe 210 to be spouted from the lower surface outlet port 211, therefore, the lower surface treatment liquid pipe 210 has a greater pipe length than when the treatment liquid is not spouted from the lower surface outlet port 211. The opposing bar 220 is fixed to the upper end of the lower surface treatment liquid pipe 210.

Therefore, it is possible to locate the opposing bar 220 at the adjacent position when the treatment liquid is spouted, and to locate the opposing bar 220 at the spaced position when the treatment liquid is not spouted. The lower surface of the wafer W is treated with the treatment liquid with the opposing bar 220 being located at the adjacent position, whereby the thin treatment liquid film is reliably retained on the lower surface of the wafer W. This makes it possible to extensively spread the treatment liquid on the lower surface of the wafer W while supplying the treatment liquid at a lower flow rate.

Since the opposing bar 220 is spaced from the lower surface of the wafer W after the treatment with the treatment liquid, the spin drying process can be performed on the wafer W by rotating the wafer W at a higher rotation speed. Thus, the wafer W can be advantageously dried after the treatment with the treatment liquid.

Figure 17:
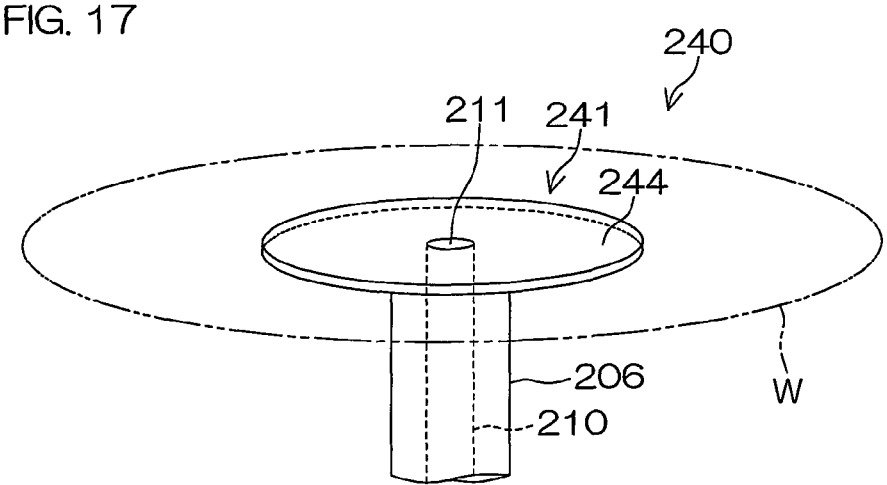
FIG. 17 is a perspective view schematically showing the construction of a substrate treatment apparatus according to a fourth embodiment of the present invention.
Figure 18:
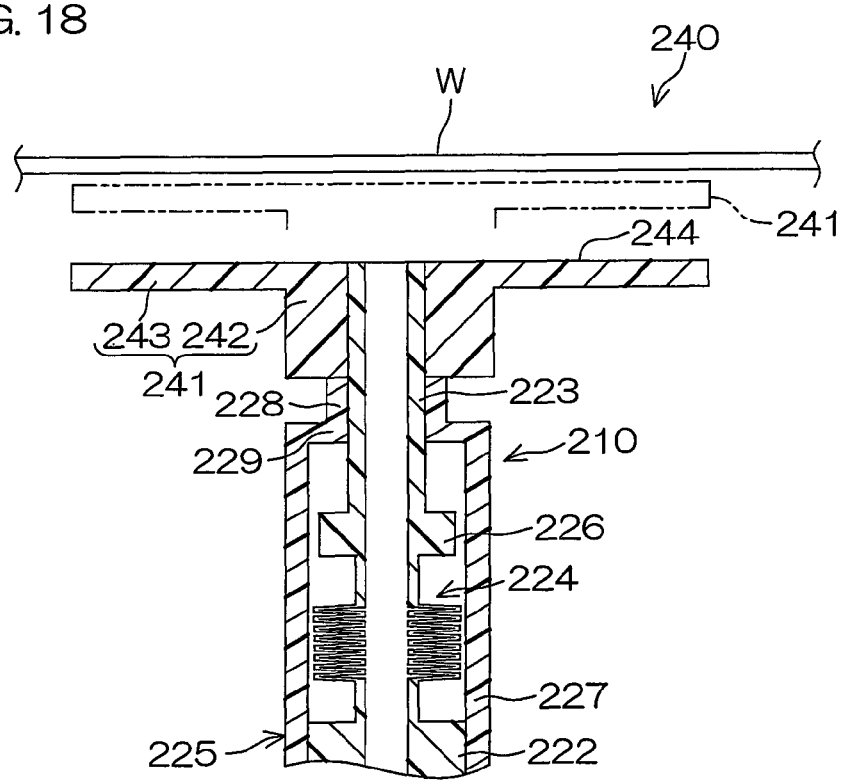
FIG. 18 is a sectional view schematically showing the construction of the substrate treatment apparatus shown in FIG. 17.

FIG. 17 is a perspective view schematically showing the construction of a substrate treatment apparatus 240 according to still another embodiment (fourth embodiment) of the present invention. FIG. 18 is a sectional view schematically showing the construction of the substrate treatment apparatus 240 shown in FIG. 17.

The substrate treatment apparatus 240 of the fourth embodiment shown in FIGS. 17 and 18 differs from the substrate treatment apparatus 201 of the third embodiment in that a disk-shaped opposing plate 241 is provided instead of the bar-shaped opposing bar 220 as the opposing member.

The opposing plate 241 includes a cylindrical fixture portion 242 (see FIG. 18) provided about the rotation center axis of the wafer W, and a disk-shaped disk portion 243 having a center aligning with the rotation center of the wafer W. The fixture portion 242 is provided instead of the fixture portion 230 of the third embodiment, and fitted around and fixed to the outlet pipe portion 223. The opposing plate 241 to be opposed to the lower surface of the wafer W has a round shape having a radius that is smaller than the rotation radius of the wafer W.

The radius of the disk portion 243 is smaller than the radius (rotation radius) of the wafer W. More specifically, the radius of the disk portion 243 is about one third the radius of the wafer W. The fixture portion 242 has a horizontal flat upper end face. Further, the disk portion 243 has a horizontal flat upper surface. The upper end face of the fixture portion 242 is flush with the upper surface of the disk portion 243. In this embodiment, the upper end face of the fixture portion 242 and the upper surface of the disk portion 243 cooperatively define a substrate opposing surface (substrate opposing portion) 244 to be opposed to the lower surface of the wafer W. The fixture portion 242 and the disk portion 243 are unitarily formed of quartz, carbon or a fluororesin such as PCTFE (polychlorotrifluoroethyelene), PVDF (polyvinylidene fluoride) or PTFE (polytetrafluoroethylene).

When the treatment liquid is spouted, the opposing plate 241 is located at an adjacent position (indicated by two-dot-and-dash lines in FIG. 18) that is adjacent to the lower surface of the wafer W. Further, when the treatment liquid is not spouted, the opposing plate 241 is located at a spaced position (indicated by a solid line in FIG. 18) at which the opposing plate 241 is spaced from the lower surface of the wafer W.

When the opposing plate 241 is located at the adjacent position in contact with the treatment liquid film retained on the lower surface of the wafer W, the film-forming treatment liquid spreads radially about the rotation center of the wafer W in a space between the opposing plate 241 and the wafer W due to the surface tension of the treatment liquid film retained on the lower surface of the wafer W, whereby the radially outward movement of the treatment liquid is promoted. This makes it possible to more advantageously spread the treatment liquid over the entire lower surface of the wafer W.

Figure 19:
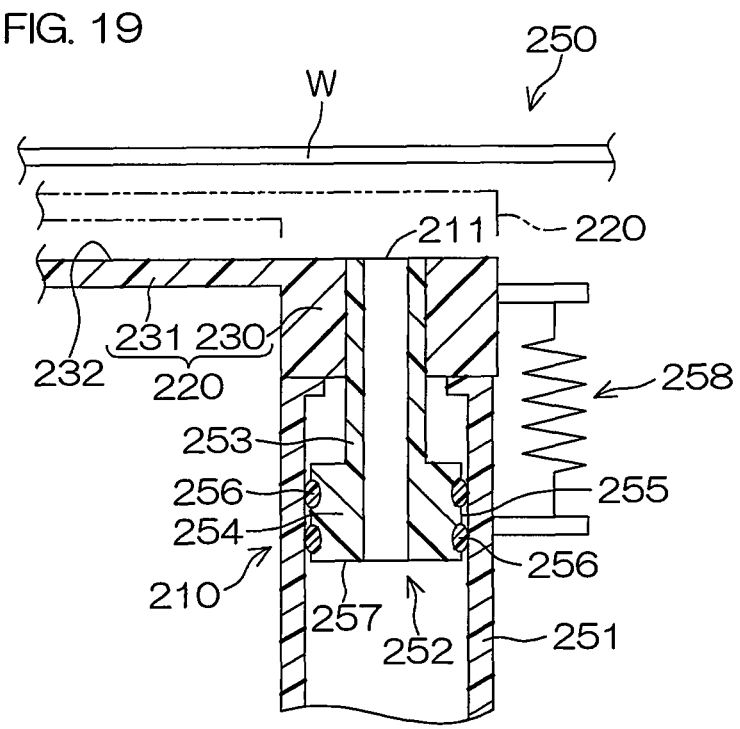
FIG. 19 is a sectional view schematically showing the construction of a substrate treatment apparatus according to a fifth embodiment of the present invention.

FIG. 19 is a sectional view schematically showing the construction of a substrate treatment apparatus 250 according to further another embodiment (fifth embodiment) of the present invention.

The substrate treatment apparatus 250 according to the fifth embodiment differs from the substrate treatment apparatus 201 according to the third embodiment in that an arrangement different from the bellows portion 224 is provided as the pipe elongating mechanism. In this embodiment, the lower surface treatment liquid pipe 210 is fixedly provided in the treatment chamber 202, and includes a cylindrical body pipe 251 connected to the lower chemical agent supply pipe 212 (see FIG. 11) and the lower deionized water supply pipe 213 (see FIG. 11), and an outlet pipe 252 fitted in the body pipe 251 in a vertically movable manner to define the distal end portion of the lower surface treatment liquid pipe 210. The body pipe 251 and the outlet pipe 252 extend vertically.

The outlet pipe 252 includes a first cylindrical portion 253 having an outer peripheral surface having a smaller diameter than an inner peripheral surface of the body pipe 251, and a second cylindrical portion 254 connected to a lower end of the first cylindrical portion 253 and having an outer peripheral surface having a greater diameter than the first cylindrical portion 253. The first cylindrical portion 253 and the second cylindrical portion 254 are coaxial with each other, and have substantially the same inner diameter. The first cylindrical portion 253 projects upward from an upper end of the body pipe 251. The lower surface outlet port 211 opens at the upper end of the body pipe 251. The fixture portion 230 of the opposing bar 220 is fitted around the outlet pipe 252. Therefore, the body pipe 251 is supported from above by the fixture portion 230.

The outer peripheral surface 255 of the second cylindrical portion 254 has a slightly smaller diameter than the inner peripheral surface of the body pipe 251. A seal member 256 for sealing a gap defined between the outer peripheral surface 255 and the inner peripheral surface of the body pipe 251 is disposed between the outer peripheral surface 255 and the inner peripheral surface of the body pipe 251. The seal member 256 prevents the treatment liquid from intruding into an upper portion of the body pipe 251 when the treatment liquid flows through the lower surface treatment liquid pipe 210.

Inner peripheral surfaces of the first cylindrical portion 253 and the second cylindrical portion 254 are defined by a single cylindrical surface. The second cylindrical portion 254 has a horizontal lower end face 257. The outer diameter of the second cylindrical portion 254 is significantly greater (three to four times greater) than the inner diameter of the second cylindrical portion 254. Therefore, the lower end face 257 of the second cylindrical portion 254 has a large area.

A spring member 258 (e.g., a tensile coil spring) is provided between the fixture portion 230 of the opposing bar 220 and the body pipe 251 of the lower surface treatment liquid pipe 210.

When the treatment liquid flows through the lower surface treatment liquid pipe 210, the treatment liquid flowing through the lower surface treatment liquid pipe 210 is spouted upward from the lower surface outlet port 211 through the outlet pipe 252. At this time, the outlet pipe 252 receives the pressure of the treatment liquid flowing vertically upward at its lower end face 257 to be thereby moved up to an adjacent position (indicated by two-dot-and-dash lines in FIG. 19) against the spring force of the spring member 258 and the weight of the opposing bar 220. In this embodiment, the pipe elongating mechanism includes the outlet pipe 252, the lower end face 257 and the spring member 258.

When the flow of the treatment liquid in the lower surface treatment liquid pipe 210 is stopped, the vertically upward force acting on the opposing bar 220 is removed, so that the opposing bar 220 is moved down by the weight of the opposing bar 220 and the spring force of the spring member 258. Thus, the opposing bar 220 is moved down to a spaced position (indicated by solid lines in FIG. 19).

While the five embodiments of the present invention have thus been described, the present invention may be embodied in other ways.

In the first and second embodiments, the nozzle 3 for supplying the treatment liquid to the upper surface of the wafer W is not necessarily required to be supported by the arm 15 which supports the opposing bar 14. Therefore, the nozzle 3 may be supported by a second arm different from the arm 15. Further, the nozzle 3 is not necessarily required to be provided in the form of a so-called scan nozzle, but may be disposed infixed relation to the spin chuck 2.

Where the treatment liquid to be supplied to the wafer W is a metal-noncorrosive liquid (e.g., deionized water, and functional water such as ion water, hydrogen water and magnetic water) in the first embodiment, a so-called metal bellows formed of a metal material may be used as the bellows 45.

Further, a resilient plate such as a leaf spring or a disk spring may be used as the resilient member. In this case, the leaf spring or the disk spring is provided instead of the coil spring 101 in the second embodiment. Where the opposing bar 14 has a light weight, the resilient member may be obviated.

In the first and second embodiments, the lower end portion of the guide 35 may be fixed to the opposing bar 14, and the upper end portion of the guide 35 may be inserted in an insertion groove (or an insertion hole) provided in the bracket 20.

In the first and second embodiments, the shape of the opposing bar 14 is not limited to the aforementioned one. For example, the head portion 33 may be provided at one of longitudinally opposite end portions of the opposing bar 14 rather than in the longitudinally middle portion of the opposing bar 14. Further, the opposing surface (lower surface) 43 of the liquid contact member 31 may be convexly curved into a cylindrical surface or an oval-cylindrical surface. Even in this case, the opposing bar 14 can receive the lift force from the treatment liquid film.

In the first and second embodiments, the liquid contact member 31 may have a steeply downwardly projecting sectional shape. That is, the opposing surface 43 of the liquid contact member 31 may include a first slant surface inclined toward the upper surface of the wafer W upstream with respect to the wafer rotation direction, and a second slant surface inclined away from the upper surface of the wafer W upstream with respect to the wafer rotation direction.

In the first and second embodiments, the opposing surface 43 (lower surface) of the liquid contact member 31 may be horizontal. In this case, the opposing surface 43 is preferably formed with a recess such as a slit, a groove or a hole, so that the opposing bar 14 can receive the lift force from the chemical agent film.

In the first and second embodiments, the opposing bar 14 may be supported directly by the arm body 70 rather than via the support bracket 20. Further, a nozzle may be inserted in the opposing bar 14, so that the treatment liquid can be spouted from the opposing surface 43 of the opposing bar 14.

In the first and second embodiments, a disk-shaped opposing member, a semicircular opposing member or a rectangular opposing member may be employed instead of the bar-shaped opposing member.

Where the opposing bar 220 and the outlet pipe 252 each have a sufficiently great weight acting thereon in the fifth embodiment, the spring member 258 may be obviated.

In the third and fourth embodiments, the bellows serving as the pipe elongating mechanism is provided unitarily with other pipe portion (the outlet pipe portion 223 or the main pipe portion 222) of the lower surface treatment liquid pipe 210, but may be provided separately from the pipe portion.

In the substrate treatment apparatus 250 according to the fifth embodiment, the opposing plate 241 employed in the fourth embodiment may be employed instead of the opposing bar 220.

In the third to fifth embodiments, the substrate opposing surface 232 of the opposing bar 220 may be a horizontal surface or a convexly curved surface such as a cylindrical surface or an oval-cylindrical surface. Further, the substrate opposing surface 232 may be a slant surface which is inclined away from the upper surface of the wafer W upstream with respect to the wafer rotation direction.

The present invention is applicable to a substrate treatment apparatus which is adapted to perform a wafer cleaning process by supplying only, deionized water to the wafer W.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2009-82841 and 2009-82842 filed in the Japan Patent Office on Mar. 30, 2009, the disclosure of which is incorporated herein by reference in its entirety.

What is claimed is:

1. A substrate treatment apparatus comprising:
   a substrate holding unit that is configured to hold a substrate horizontally;
   a substrate rotating unit that is configured to rotate the substrate held by the substrate holding unit about a vertical axis;
   a treatment liquid pipe including an outlet pipe portion having an outlet port to be opposed to a lower surface of the substrate held by the substrate holding unit so as to spout a treatment liquid to form a liquid film of the treatment liquid on the lower surface of the substrate, the treatment liquid pipe extending downward along the vertical axis from the outlet port, and having an inside space through which the treatment liquid to be supplied to the outlet port flows;
   an opposing member fixed to an upper end part of the outlet pipe portion and having an opposing surface configured to oppose to the lower surface of the substrate held by the substrate holding unit;
   a pipe elongating mechanism that is configured to elongate the treatment liquid pipe so as to move the outlet pipe portion upward by a pressure of the treatment liquid to cause the treatment liquid pipe to have a greater pipe length when the treatment liquid flows through the treatment liquid pipe than when the treatment liquid does not flow through the treatment liquid pipe such that in response to such pressure, the opposing member moves up to an adjacent position where the opposing surface is close to the lower surface of the substrate held by the substrate holding unit and contacts the liquid film of the treatment liquid formed on the lower surface of the substrate so as to maintain the liquid film between the opposing surface and the lower surface of the substrate; and
   a guide cylinder that guides an outer peripheral surface of the outlet pipe portion which is moved up and down by the pipe elongating mechanism.

2. The substrate treatment apparatus according to claim 1, wherein the pipe elongating mechanism includes a bellows provided in an intermediate pipe wall portion of the treatment liquid pipe.

3. The substrate treatment apparatus according to claim 1, wherein the opposing member includes a bar-shaped substrate opposing portion that is configured to oppose to the lower surface of the substrate held by the substrate holding unit and that extends radially about a rotation center of the substrate rotated by the substrate rotating unit.

4. The substrate treatment apparatus according to claim 3, wherein the bar-shaped substrate opposing portion includes a round-shaped substrate opposing surface, in a cross sectional view.

5. The substrate treatment apparatus according to claim 4, wherein the round-shaped substrate opposing surface includes an oval surface that has a major axis which extends horizontally and a minor axis which extends vertically, in the cross sectional view.

6. The substrate treatment apparatus according to claim 1, wherein the opposing member includes a round-shaped substrate opposing portion that is configured to oppose to the lower surface of the substrate held by the substrate holding unit and that has a round shape which has a smaller radius than a rotation radius of the substrate rotated by the substrate rotating unit.

7. The substrate treatment apparatus according to claim 1, wherein the pipe elongating mechanism is disposed at an intermediate of the treatment liquid pipe, the treatment liquid pipe includes a lower portion that is stationarily disposed below the pipe elongating mechanism,
   the pipe elongating mechanism is configured such that the opposing member moves up with respect to the lower portion of the treatment liquid pipe in accordance with the elongating of the pipe length of the treatment liquid pipe.

8. The substrate treatment apparatus according to claim 1, wherein the pipe elongating mechanism is configured such that the opposing member moves up and moves down, in accordance with the elongating and a contracting of the pipe length of the treatment liquid pipe, between the adjacent position and a spaced position where the opposing surface is separated from the liquid film of the treatment liquid formed on the lower surface of the substrate.

9. The substrate treatment apparatus according to claim 1, further comprising an elongating restriction member that is configured to restrict the elongating of the pipe length of the treatment liquid pipe by the pipe elongating mechanism.

10. The substrate treatment apparatus according to claim 1, further comprising a treatment liquid supplying unit that is configured to supply the treatment liquid to the treatment liquid pipe.

11. The substrate treatment apparatus according to claim 1, further comprising a chemical liquid supplying unit that is configured to supply a chemical liquid as the treatment liquid to the treatment liquid pipe,
    wherein the treatment liquid pipe is formed of a material which has a resistance against the chemical liquid.

12. The substrate treatment apparatus according to claim 1, wherein the opposing member is formed of at least one material selected among a quartz, a carbon, and a fluororesin.

13. The substrate treatment apparatus according to claim 1, wherein the treatment liquid pipe includes a body pipe provided in a static state, the outlet pipe is interpolated to the body pipe in a vertically movable manner, the outlet pipe has a lower end part which has a contact surface that contacts with the treatment liquid that flows through an inside space of the body pipe, and
    the pipe elongating mechanism includes an elastic member disposed between the opposing member and the body pipe.

14. The substrate treatment apparatus according to claim 1, wherein the guide cylinder is configured to regulate the upward movement of the outlet pipe.

15. The substrate treatment apparatus according to claim 1, further comprising an elongating restriction member that is configured to restrict the elongating of the pipe length of the treatment liquid pipe by the pipe elongating mechanism, wherein the elongating restriction member is disposed outside a treatment liquid flow path of the treatment liquid pipe.

16. The substrate treatment apparatus according to claim 1, further comprising an elongating restriction member that is configured to restrict the elongating of the pipe length of the treatment liquid pipe by the pipe elongating mechanism, wherein the treatment liquid pipe includes a single pipe that integrally includes the outlet pipe portion and penetrates the guide cylinder, and the elongating restriction member is disposed outside a treatment liquid flow path of the single pipe of the treatment liquid pipe.

17. The substrate treatment apparatus according to claim 1, further comprising an elongating restriction member that is configured to restrict the elongating of the pipe length of the treatment liquid pipe by the pipe elongating mechanism, and a sealing member that sealingly partitions a space where the elongating restriction member is disposed and a treatment liquid flow path of the treatment liquid pipe.

\* \* \* \* \*